(12) United States Patent
Hidaka et al.

(10) Patent No.: US 6,215,141 B1
(45) Date of Patent: *Apr. 10, 2001

(54) SEMICONDUCTOR DEVICE INCLUDING A TRANSISTOR HAVING PORTIONS OF SOURCE AND DRAIN REGIONS REMOVED BY THE SAME AMOUNT

(75) Inventors: Hideto Hidaka; Takahiro Tsuruda; Katsuhiro Suma, all of Hyogo (JP)

(73) Assignee: Mitsubhishi Denki Kabsuhiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/668,013

(22) Filed: Jun. 17, 1996

Related U.S. Application Data

(63) Continuation-in-part of application No. 08/546,746, filed on Oct. 23, 1995, now Pat. No. 6,060,738.

(30) Foreign Application Priority Data

Jan. 12, 1993 (JP) ............................................... 5-301899

(51) Int. Cl.$^7$ ............................................................... H01L 29/72
(52) U.S. Cl. ............................ 257/298; 257/303; 257/308; 257/332; 257/401; 257/750; 257/773
(58) Field of Search .................................... 257/332, 298, 257/303, 308, 401, 750, 773

(56) References Cited

U.S. PATENT DOCUMENTS 5,508,541 * 4/1996 Hieda et al. ........................ 257/332

* cited by examiner

*Primary Examiner*—Edward Wojciechowicz
(74) *Attorney, Agent, or Firm*—McDermott, Will & Emery

(57) ABSTRACT

In manufacturing a semiconductor device, the thickness of source and drain regions is maintained equal by performing the same number of etching steps on each source and drain region. This procedure can be applied to various types of semiconductor devices, such as a memory cell transistor of a DRAM, stack-type memory cell transistor of a DRAM, a peripheral circuit of a DRAM, a semiconductor device formed on an SOI structure, and a trench-type memory cell of a DRAM formed on an SOI structure. By maintaining the source and drain regions at the same thickness, the resistance values are maintained, thereby avoiding deterioration of the transistor characteristics.

18 Claims, 29 Drawing Sheets

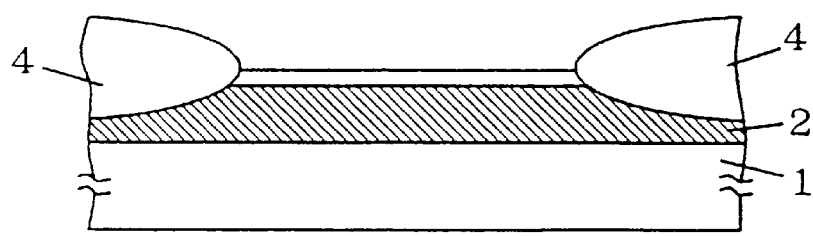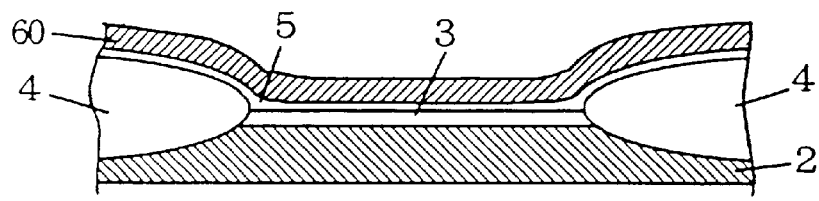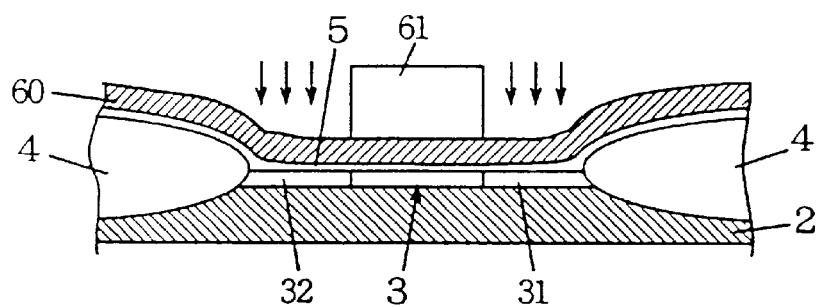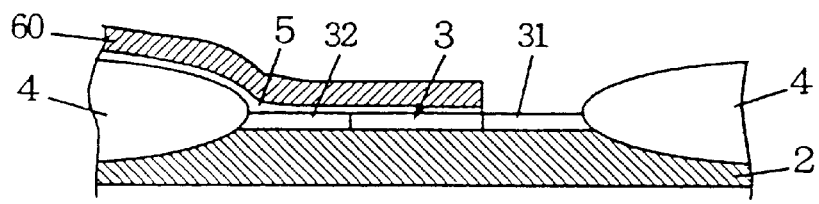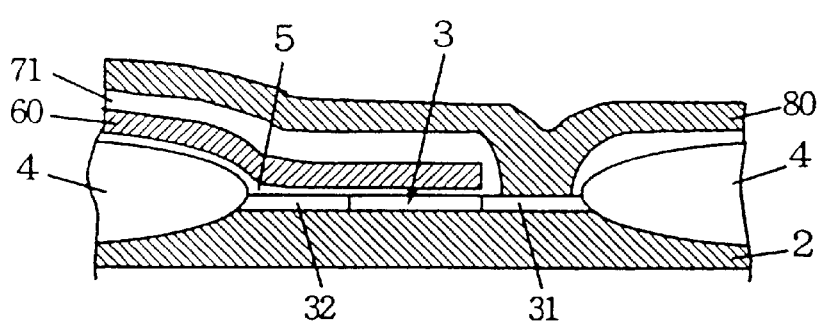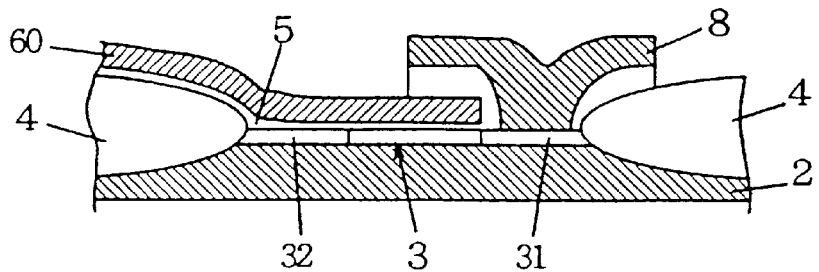

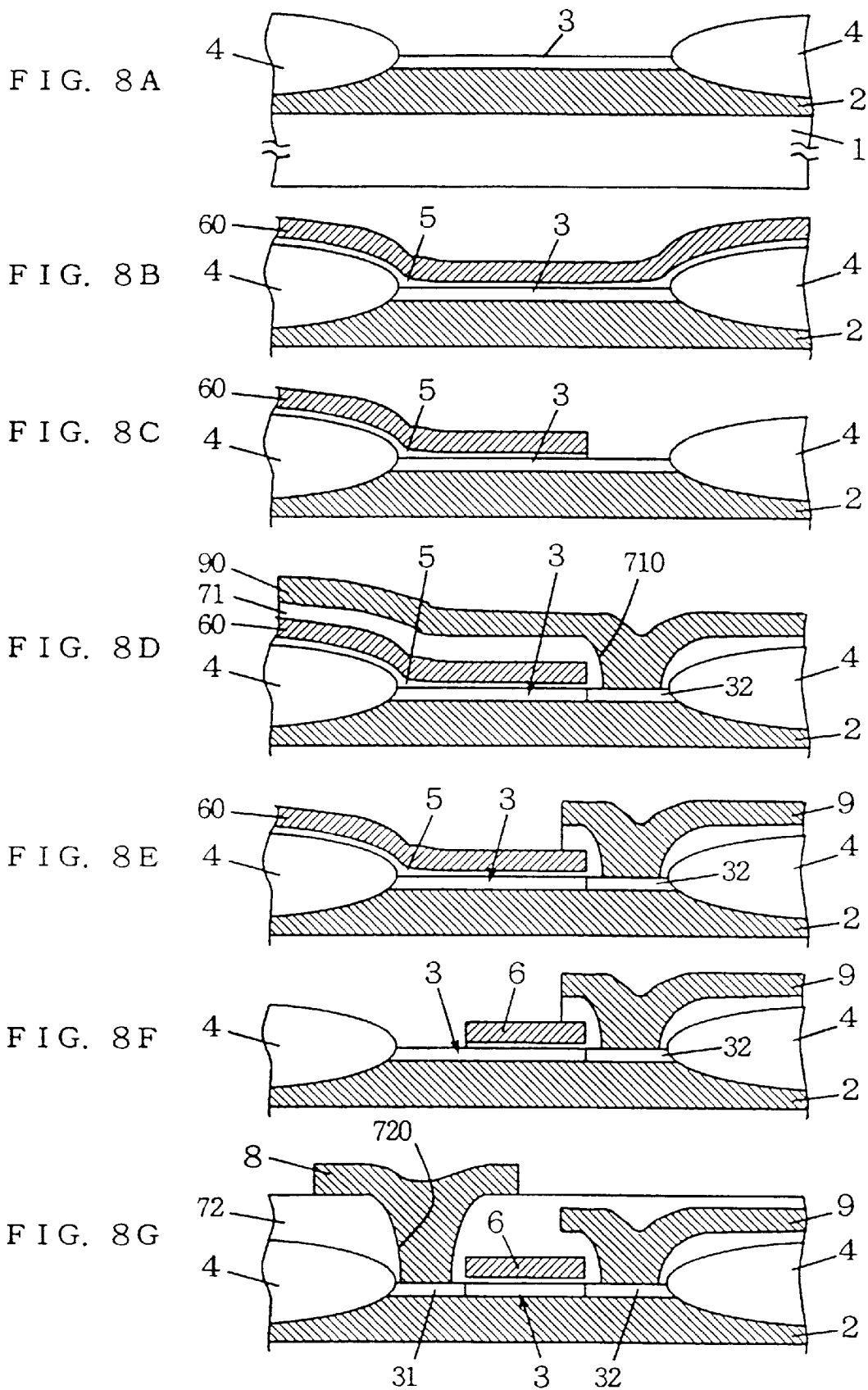

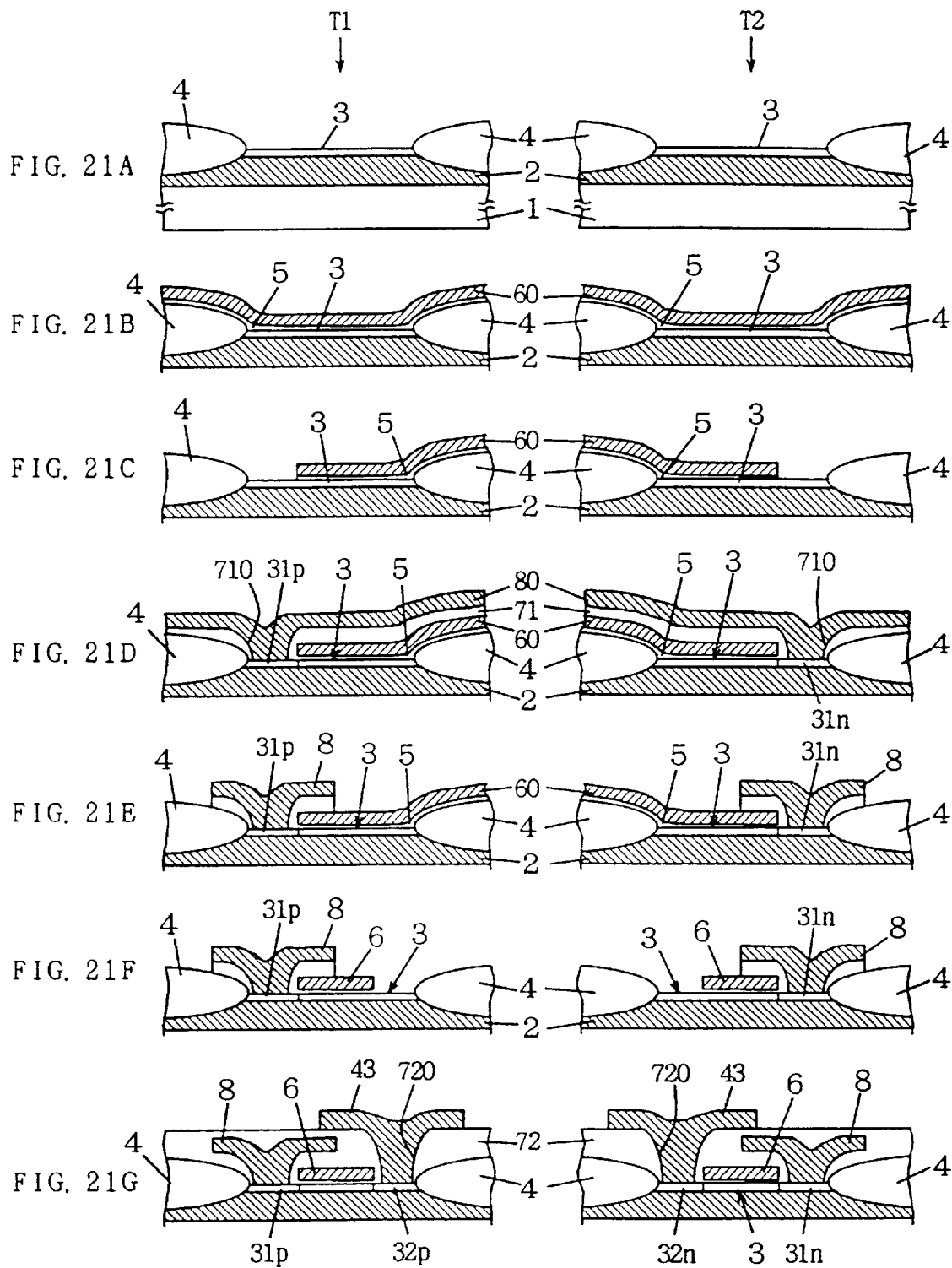

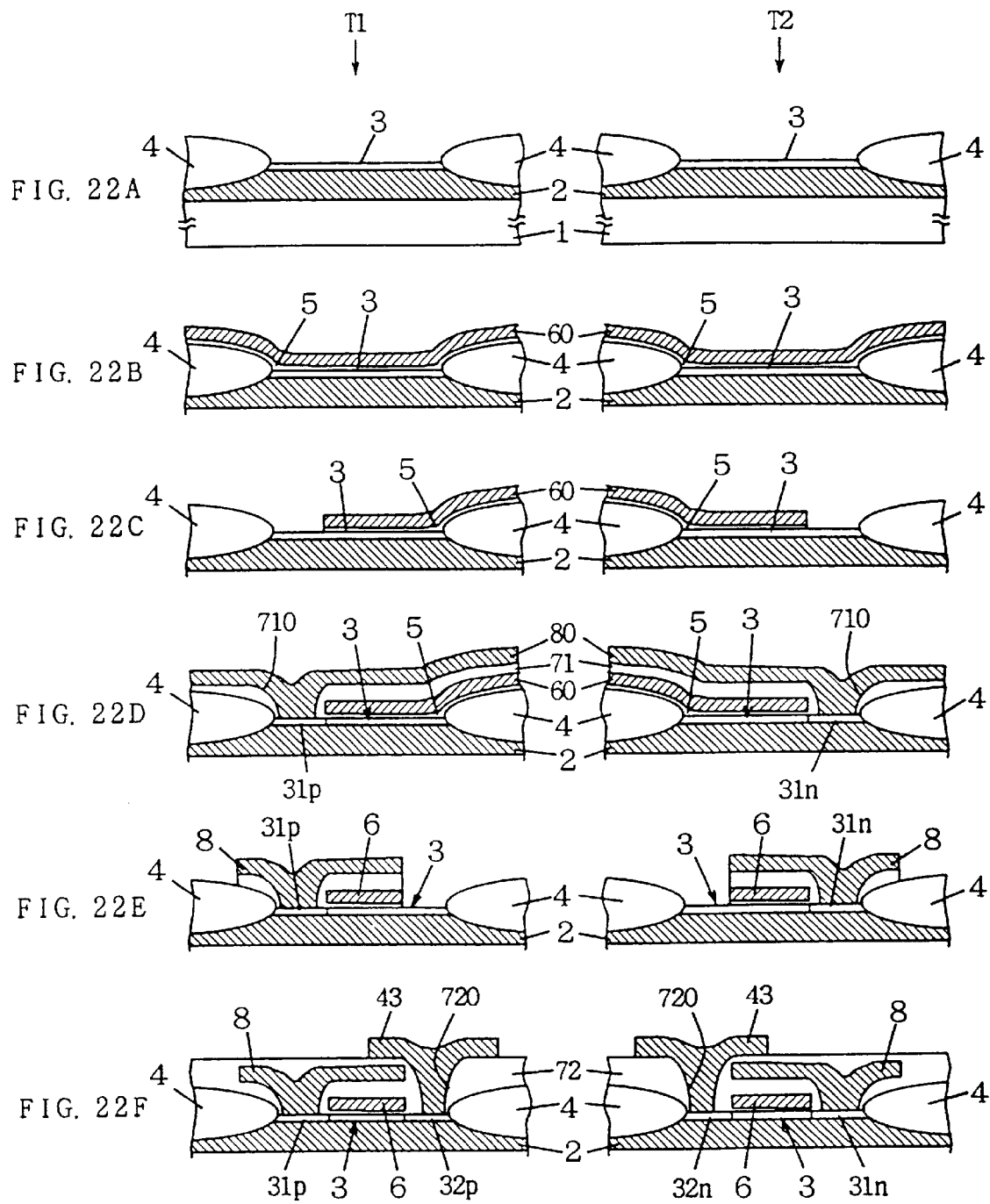

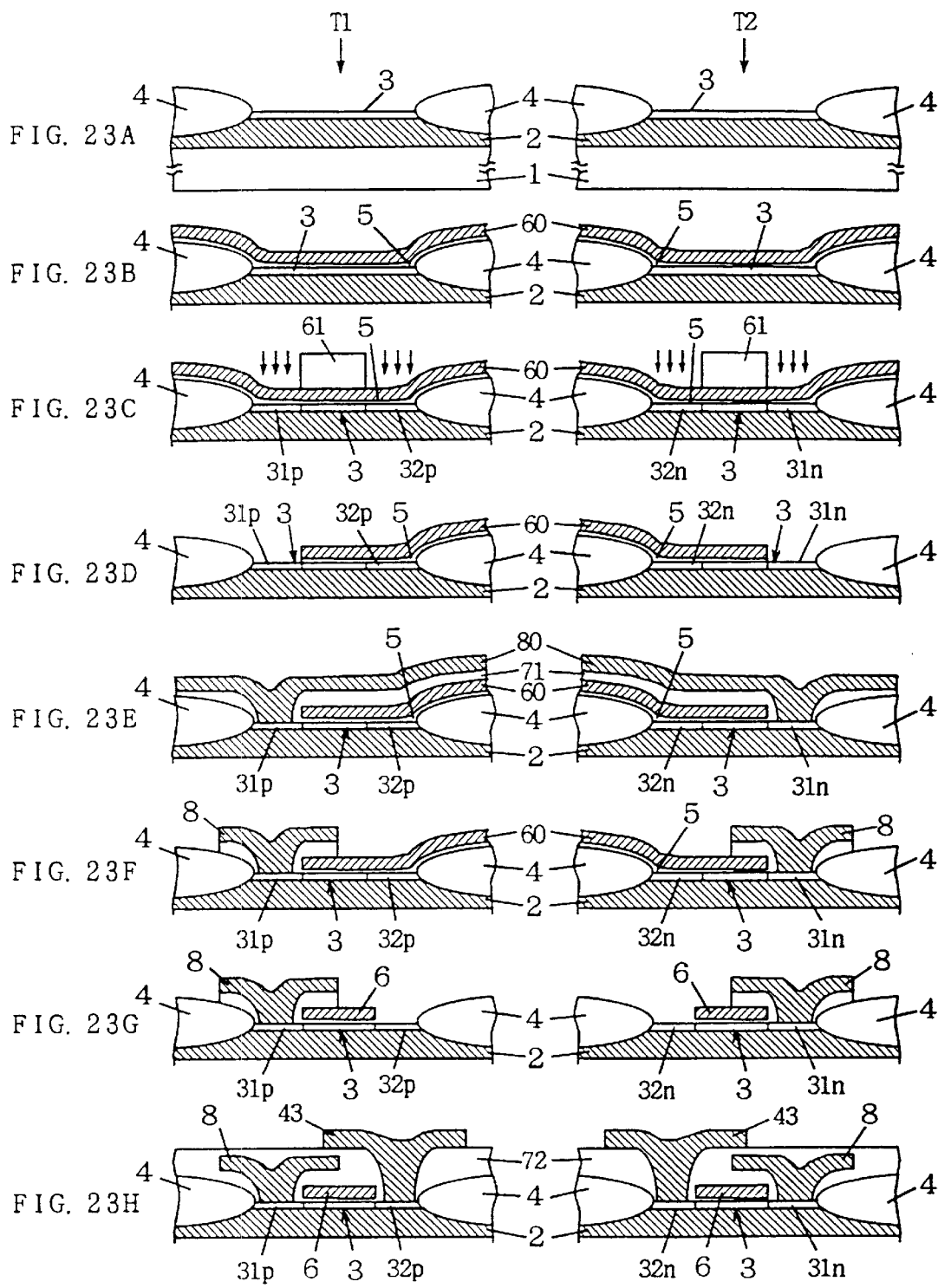

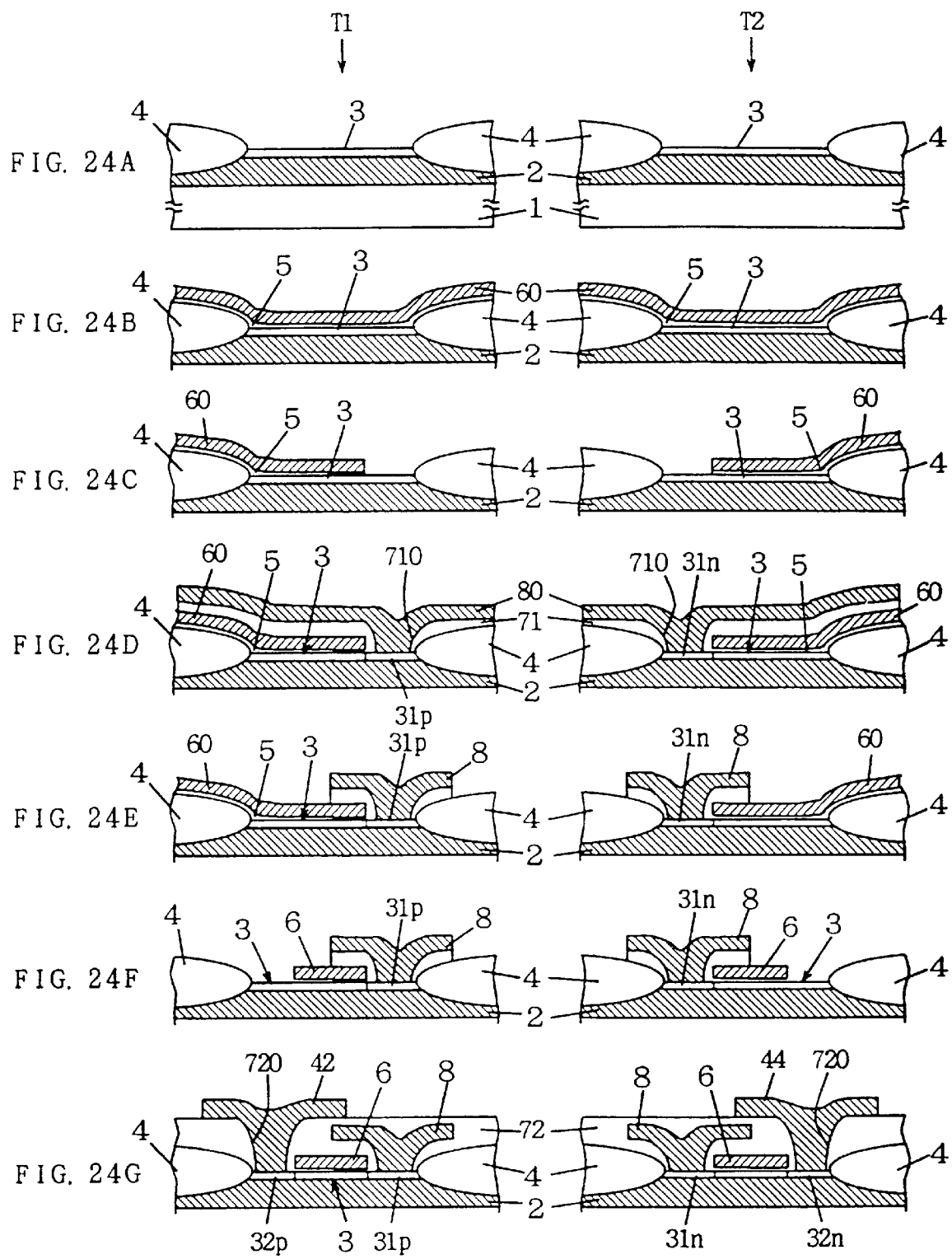

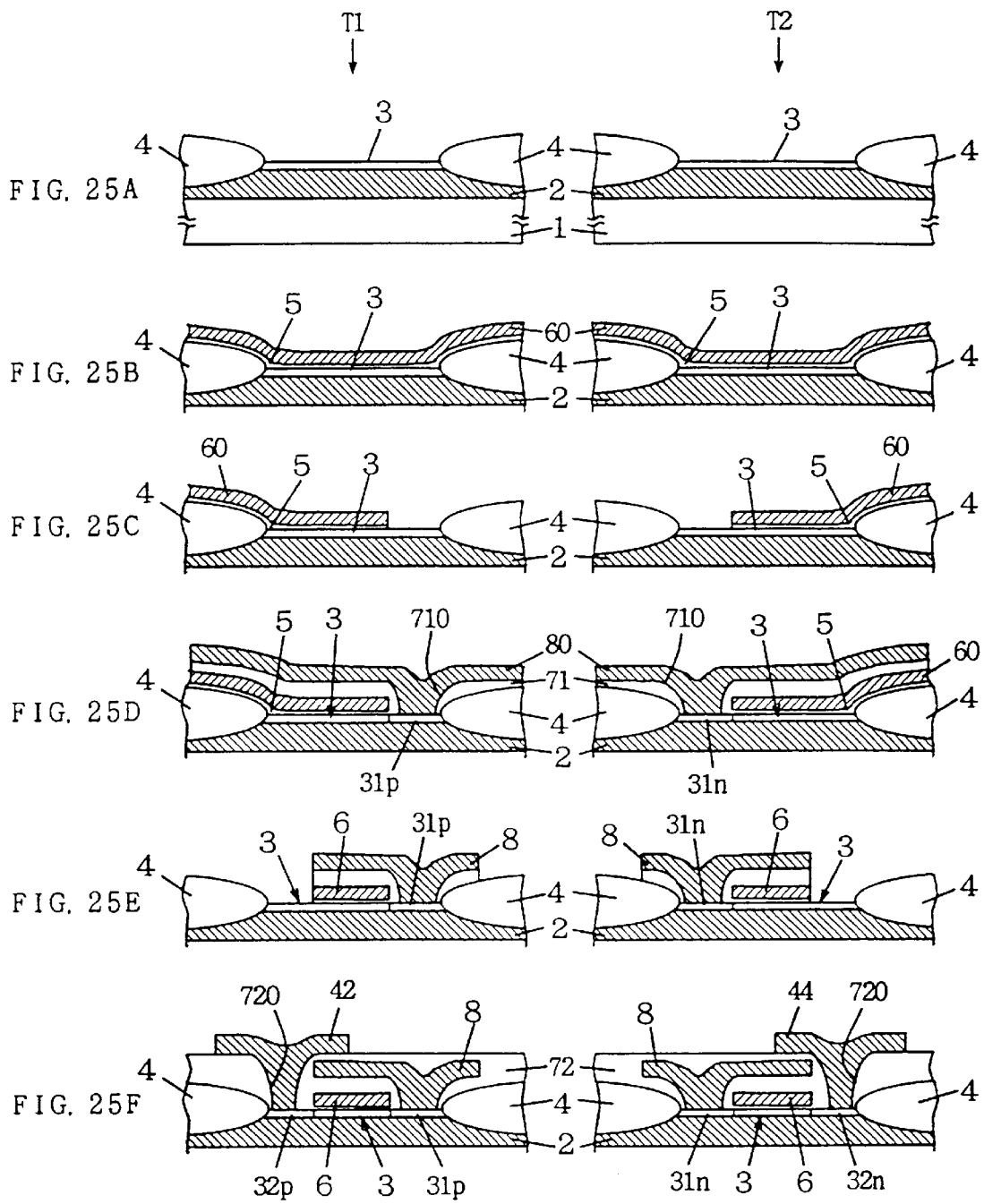

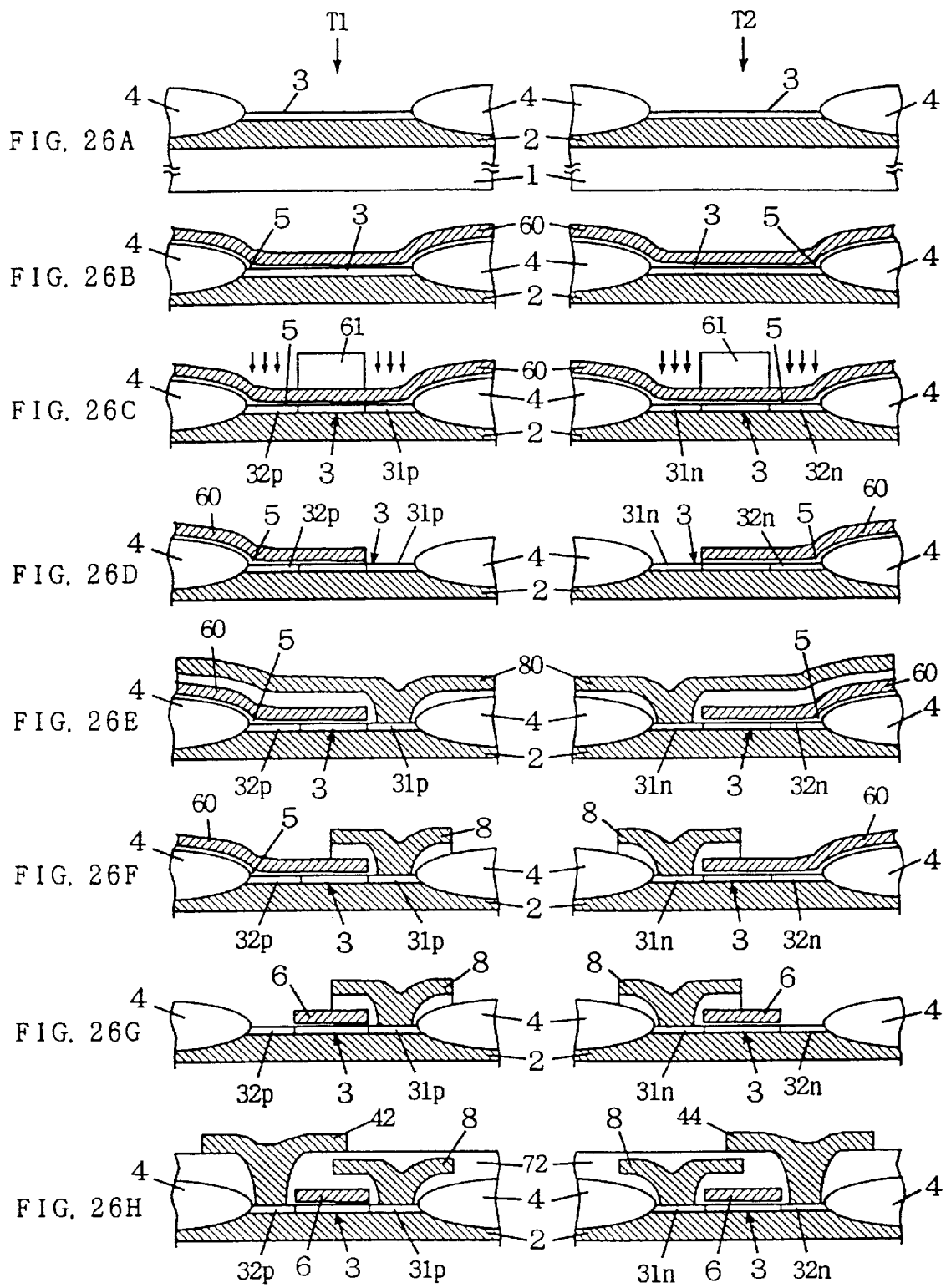

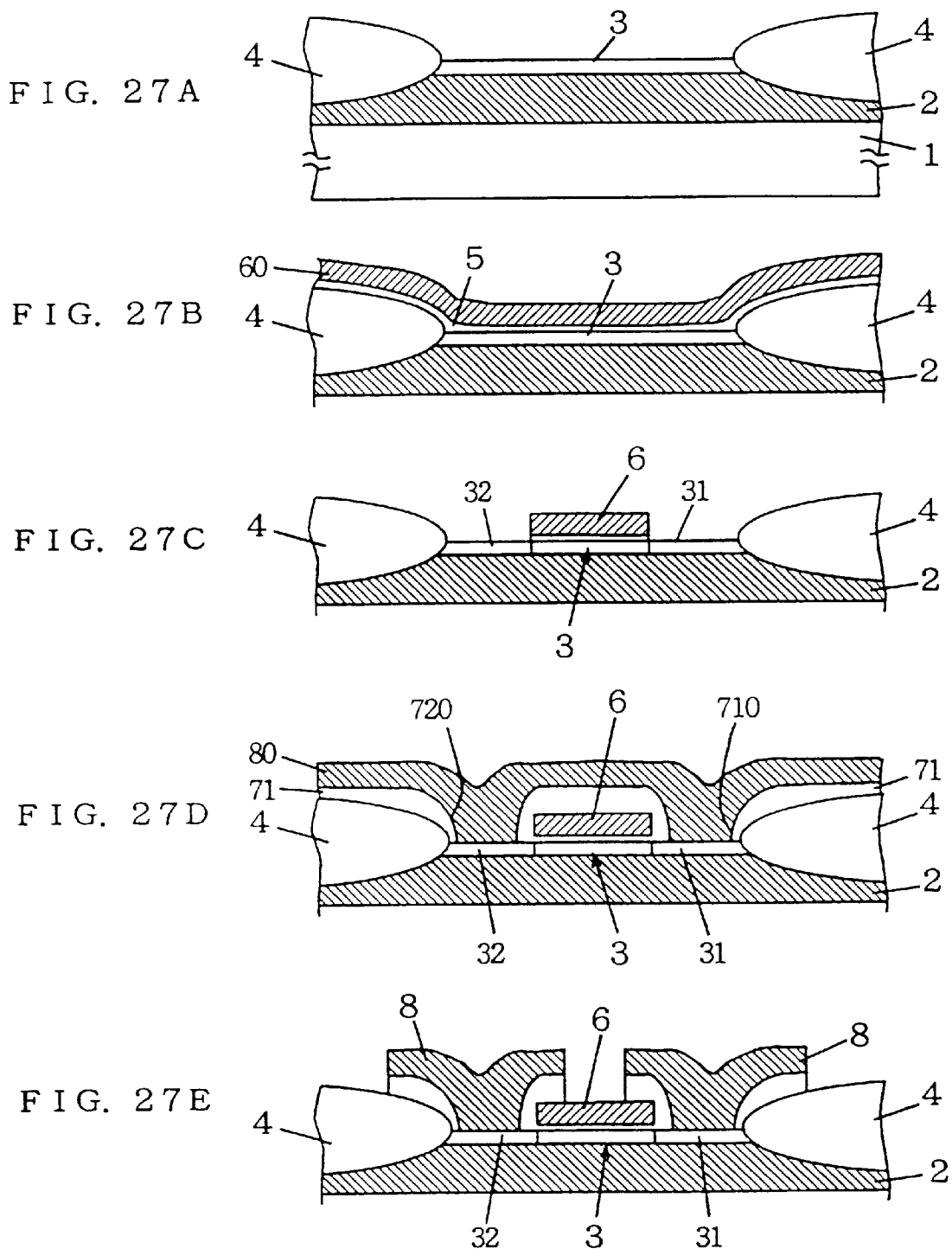

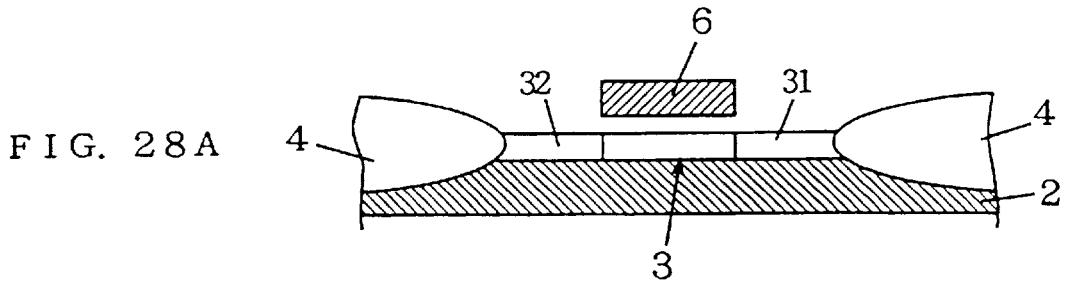
FIG. 28A
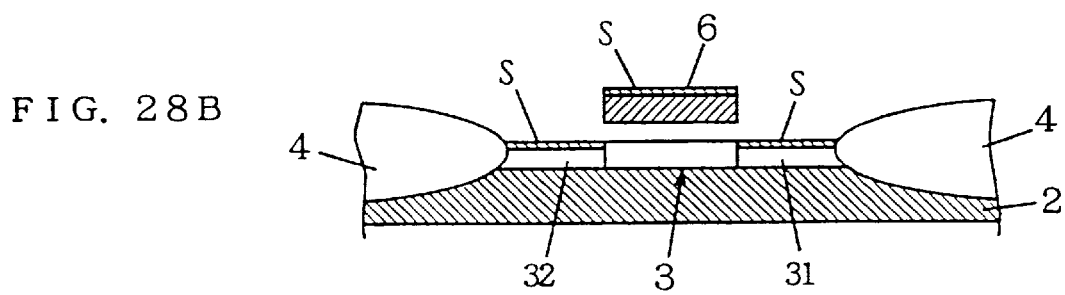
FIG. 28B
FIG. 29
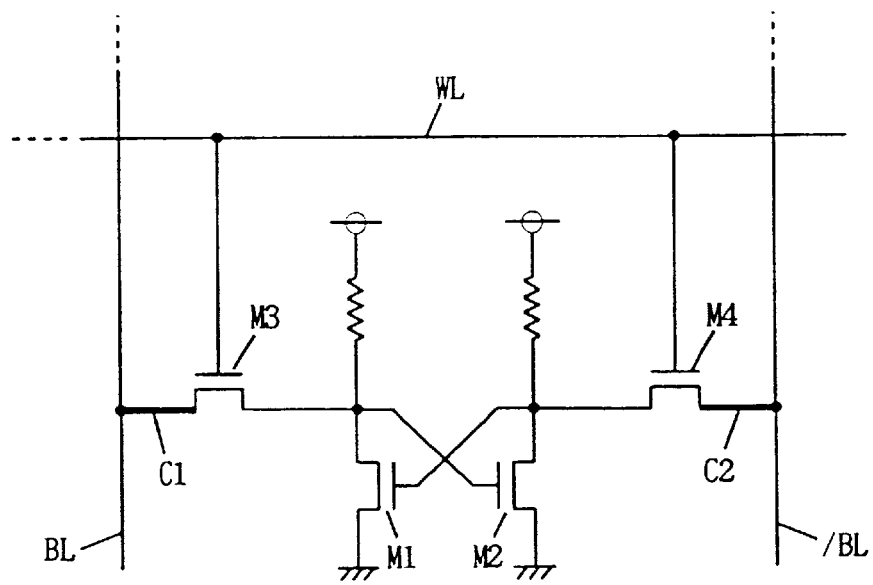

_US 6,215,141 B1_

SEMICONDUCTOR DEVICE INCLUDING A TRANSISTOR HAVING PORTIONS OF SOURCE AND DRAIN REGIONS REMOVED BY THE SAME AMOUNT

RELATED APPLICATIONS

This application is a continuation-in-part of application Ser. No. 08/546,746, filed Oct. 23, 1995 now U.S. Pat. No. 6,060,738, issued May 9, 2000.

BACKGROUND OF THE INVENTION

1. Field of the Invention

The present invention relates to a method of manufacturing a semiconductor device, and more particularly to a method of manufacturing a semiconductor device having an SOI (Silicon on Insulator) structure.

2. Description of the Background Art

A dynamic random access memory (referred to as DRAM hereinafter) that allows random input and output of stored information is well known as a semiconductor device. A DRAM includes a memory cell array which is the memory region of storing information and a peripheral circuit required for input/output with respect to an external source.

An exemplary structure of a DRAM memory cell will be described hereinafter. FIG. 30 is a sectional view of a genal DRAM memory cell. This memory cell includes a typical stacked type capacitor.

Referring to FIG. 30, a memory cell includes one transfer gate transistor and one stacked type capacitor.

The transfer gate transistor includes a pair of source/drain regions 30, 30 formed on a surface of a silicon substrate 1, and a gate electrode (word line) 6 formed on the surface of silicon substrate 1 with an insulating layer therebetween.

The stacked type capacitor includes a lower electrode (storage node) 9 extending from over gate electrode 6 to a field isolation film 4, and having a portion thereof connected to one of source/drain regions 30, 30, a dielectric layer 901 formed on the surface of lower electrode 9, and an upper electrode (cell plate) 902 formed thereon.

A bit line 10 is connected to the other source/drain region 30 of the transfer gate transistor via a bit line contact unit 100.

In recent years, the technology of transistors using an SOI structure has evolved. Such a transistor of an SOI structure is characterized in that the operation of circuitry is speeded, according to reduction in the capacitance between the interconnection and the substrate, i.e. the wiring capacitance. When this transistor is applied to a CMOS, the latch up phenomenon can be prevented. There are also various advantages such as the short channel effect is reduced, the current driving capability and the subthreshold characteristics are improved.

Therefore, application of an SOI structure into a memory cell of a DRAM is considered.

However, in the stage of applying an SOI structure into a memory cell of a DRAM, the following problems were generated.

FIGS. 31A–31F are sectional views of a memory cell of an SOI structure showing the first to sixth manufacturing steps thereof for describing the problems encountered in the manufacturing process. The main steps of the manufacturing method of the present memory cell are shown.

Referring to FIG. 31A, a silicon substrate 1 is prepared. Oxygen ions are implanted from above silicon substrate 1 with silicon substrate 1 is heated to a predetermined temperature. Then, annealing is carried out at a high temperature.

As a result, silicon substrate 1 reacts with the oxygen ions, whereby an insulating layer 2 of silicon oxide ($SiO_2$) is formed. The defects generated by oxygen ion implantation are eliminated, whereby the crystalline property thereof is recovered. As a result, a silicon layer of single crystalline (referred to as SIO layer hereinafter) 3 is formed.

Thus, an insulating layer 2 is located at the depth of 5000–10000 Å from the top face of the original silicon substrate. On insulating layer 2, a first conductivity type SOI layer 3 having a thickness of approximately 1000 Å is formed.

Then, a field oxide film 4 is formed on the main surface of silicon substrate 1.

Referring to FIG. 31B, the surface of SOI layer 3 is processed by thermal oxidation, whereby a gate oxide film 5 is formed on the surface of SOI layer 3. Gate oxide film 5 has a thickness of approximately 100 Å. Here, the thickness of SOI layer 3 is reduced by the thickness of gate oxide film 5. Then, a gate electrode layer 60 of polysilicon is formed on gate oxide film 5.

Referring to FIG. 31C, using a resist pattern (not shown) formed on gate electrode layer 60 located above the center portion between field oxide films 4, 4 as a mask, gate electrode layer 60 and gate oxide film 5 are etched away to be patterned. By this patterning, gate electrode 6 is formed.

In this patterning step, SOI layer 3 beneath gate electrode layer 60 removed by etching is also removed due to that etching process.

Referring to FIG. 31D, ions are implanted into one of the pair of regions in SOI layer 3 sandwiching the region beneath gate electrode 6 between field insulating films 4, 4, whereby a first impurity region (drain region or source region) 31 of a second conductivity type is formed.

Then, an interlayer insulating layer 71 is formed so as to cover the surface of SOI layer 3, gate electrode 6, and field oxide films 4, 4. Interlayer insulating layer 71 on first impurity region 31 is removed by etching. As a result, a contact hole 71 is formed.

In this formation of contact hole 710, SOI layer 3 is removed by the influence of the etching process. Then, a bit line layer 100 of polysilicon is formed on the surface of interlayer insulating layer 71 so as to come into contact with SOI layer 3 through contact hole 710.

Referring to FIG. 31E, using a resist pattern (not shown) of a predetermined configuration as a mask, bit line layer 100 is etched away to be patterned. In this patterning process, interlayer insulating layer 71 on a region of SOI layer 3 located opposite to first impurity region 31 with the region beneath gate electrode 6 therebetween is removed by etching at the same time. This is because interlayer insulating layer 71 is etched easier than bit line layer 100 of polysilicon.

As interlayer insulating layer 71 is removed, the portion of SOI layer 3 beneath the removed interlayer insulating layer 71 is also exposed and removed.

Referring to FIG. 31F, ions are implanted into the exposed SOI layer 3, whereby an impurity region 32 of a second conductivity type is formed. Then, an interlayer insulating layer 72 is formed. Interlayer insulating layer 72 located on the region of SOI layer 3 opposite to first impurity region 31 with the region beneath gate electrode layer 6 therebetween is removed by etching to form a contact hole 720. In the formation of contact hole 720, SOI layer 3 is removed due to this etching process.

Then, a lower electrode layer is formed on the surface of interlayer insulating layer 72 so as to come into contact with SOI layer 3 through contact hole 720. The lower electrode layer is patterned, whereby a storage node (lower electrode) 9 is formed.

After this step of FIG. 31F, a dielectric layer and a cell plate (upper electrode) are sequentially formed on storage node 9.

When an SOI structure is applied to a DRAM memory cell, there was the problem that the thickness of SOI layer 3 is reduced in manufacturing a memory cell. In the worst case, a through hole in SOI layer 3 was generated. The reason why the thickness of SOI layer 3 is reduced is summarized as follows.

First, the thickness of SOI layer 3 is reduced due to the thermal oxidation process in forming gate oxide film 5. Then, SOI layer 3 is removed also in the patterning process of gate electrode layer 60. SOI layer 3 is also removed during formation of contact holes 710 and 720. Furthermore, SOI layer 3 is removed in patterning the conductive layer located right above the gate electrode such as bit line layer 100.

When this impurity region is to be formed as a LDD (Lightly Doped Drain) structure, SOI layer 3 is also removed in the etching process of the sidewall.

Thus, there was the problem that the thickness of the SOI layer is significantly removed during the manufacturing process in the case where an SOI structure is applied to a DRAM memory cell. This reduction causes various problems such as contact failure between the SOI layer and a conductive layer such as a storage node in contact thereto.

In a conventional semiconductor device wherein a source and a drain of a transistor formed on a silicon substrate are coupled to different layers, contact holes on the source and drain regions are generally formed through different steps. When forming such contact holes, oxide film portions on the source and drain regions are generally overetched to the extent to remove even the source and drain layers to different depths. FIG. 32 is a schematic diagram showing such situation where the source and drain layers are removed to different depths as a result of overetching. In FIG. 32, one source/drain layer 31 and another source/drain layer 32 formed in a substrate 1 and to be coupled to different layers 10 and 9 are overetched through different steps when forming the corresponding contact holes, resulting in a difference in film thickness between the source and drain sides. Such difference in film thickness causes a difference in resistance values of the source and drain, which difference deteriorates transistor characteristics. In case of a transistor formed on a SOI structure as shown in FIG. 33 where the insulating layer 2 is provided, especially, there is a possibility that one of the source/drain layers 31,32 may be removed to its entire depth due to overetching and electric contact to the source/drain of the transistor may not be formed.

More specifically, with reference to the steps of the conventional example shown in FIGS. 31A–31F, both source and drain regions are damaged when etching the gate electrode in the step shown in FIG. 31C (the first damage), and then only one source/drain region is further damaged when etching the first connecting layer in the step shown in FIG. 31E (the second damage). These damages caused by a different number of etching steps result in a difference in film thickness between the source and drain regions and unfavorable effects on transistor characteristics. In the case of an SOI structure, the one source/drain film subjected to etching damages twice might be fully removed and disappear.

The above-described status is encountered not only in a DRAM memory cell, but also in a general transistor. More specifically, it occurs in the case where the structure right above a source region differs from that right above a drain region in a pair of source/drain regions in a transistor. A typical example of a transistor of such a structure is a transistor of a DRAM memory cell.

The type of a conductive layer right above the source/drain region of a transistor differs depending upon the structure of the memory cell. Therefore, the above described problem also occurs in the case where the conductive layer right above the source/drain region of the transistor is a polypad, a storage node interconnection layer, or a bit line interconnection layer.

The above-described problem is not limited to a DRAM memory cell, and is seen also in a SRAM (problems identical to those in a DRAM memory cell occurs). Furthermore, the above-described problem occurs in a general CMOS circuit in which polypads are respectively formed at the power supply side and the ground side, and not formed at the signal output side, or vice versa.

SUMMARY OF THE INVENTION

An object of the present invention is a semiconductor device comprising source/drain regions having the same resistance.

Another object of the present invention is a semiconductor device comprising a transistor having source and drain regions with the same film thickness.

A semiconductor device in accordance with the present invention comprises a transistor with a source and drain region having the same film thickness. Certain aspects of the present invention comprise a semiconductor device wherein the source and drain of the transistor are formed on a silicon substrate or on an SOI structure, wherein the source and drain regions are coupled to different layers. In each such aspect of the present invention, the source and drain regions of the transistor have the same film thickness.

In other aspects of the present invention, a memory cell transistor of a DRAM is formed on a silicon substrate or on an SOI structure, wherein the source and drain regions of the transistor have the same film thickness.

Other aspects of the present invention include a stack-type memory cell transistor of a DRAM formed on a silicon substrate or on an SOI structure, wherein a bit line underlies or overlies a storage node. In all such aspects of the present invention, the source and drain regions of the transistor have the same film thickness.

Other aspects of the present invention comprise a trench-type memory cell transistor of a DRAM formed on a silicon substrate or on an SOI structure, wherein the source and drain regions of the transistor have the same film thickness.

Further aspects of the present invention include a peripheral circuit transistor of a DRAM formed on a silicon substrate or on an SOI structure, wherein the source and drain regions of the transistor have the same film thickness.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6F and FIGS. 7A and 7B are sectional views of a memory cell showing manufacturing steps in order according to a third embodiment.

FIGS. 8A–8G are sectional views of a memory cell showing the manufacturing steps in order according to a fourth embodiment.

FIGS. 21A–21G are sectional views of a CMOS inverter showing manufacturing steps thereof in order according to a ninth embodiment.

FIGS. 22A–22F are sectional views of a CMOS inverter showing manufacturing steps thereof in order according to a tenth embodiment.

FIGS. 23A–23H are sectional views of a CMOS inverter showing the manufacturing steps thereof in order according to an eleventh embodiment.

FIGS. 24A–24G are sectional views of a CMOS inverter showing the manufacturing steps thereof in order according to a twelfth embodiment.

FIGS. 25A–25F are sectional views of a CMOS inverter showing the manufacturing steps thereof in order according to a thirteenth embodiment.

FIGS. 26A–26H are sectional views of a CMOS inverter showing the manufacturing steps thereof in order according to a fourteenth embodiment.

FIGS. 27A–27E are sectional views of a MOS transistor utilizing an SOI structure in a peripheral circuit showing manufacturing steps thereof in order according to a fifteenth embodiment.

FIGS. 28A and 28B are sectional views of a salicide structured MOS transistor in a peripheral circuit according to a sixteenth embodiment showing manufacturing steps thereof in order.

FIG. 29 is a circuit diagram of a S RAM memory cell employing a polypad.

DESCRIPTION OF THE PREFERRED EMBODIMENTS

Embodiments of the present invention will be described hereinafter with reference to the drawings.

First Embodiment

Figure 1:
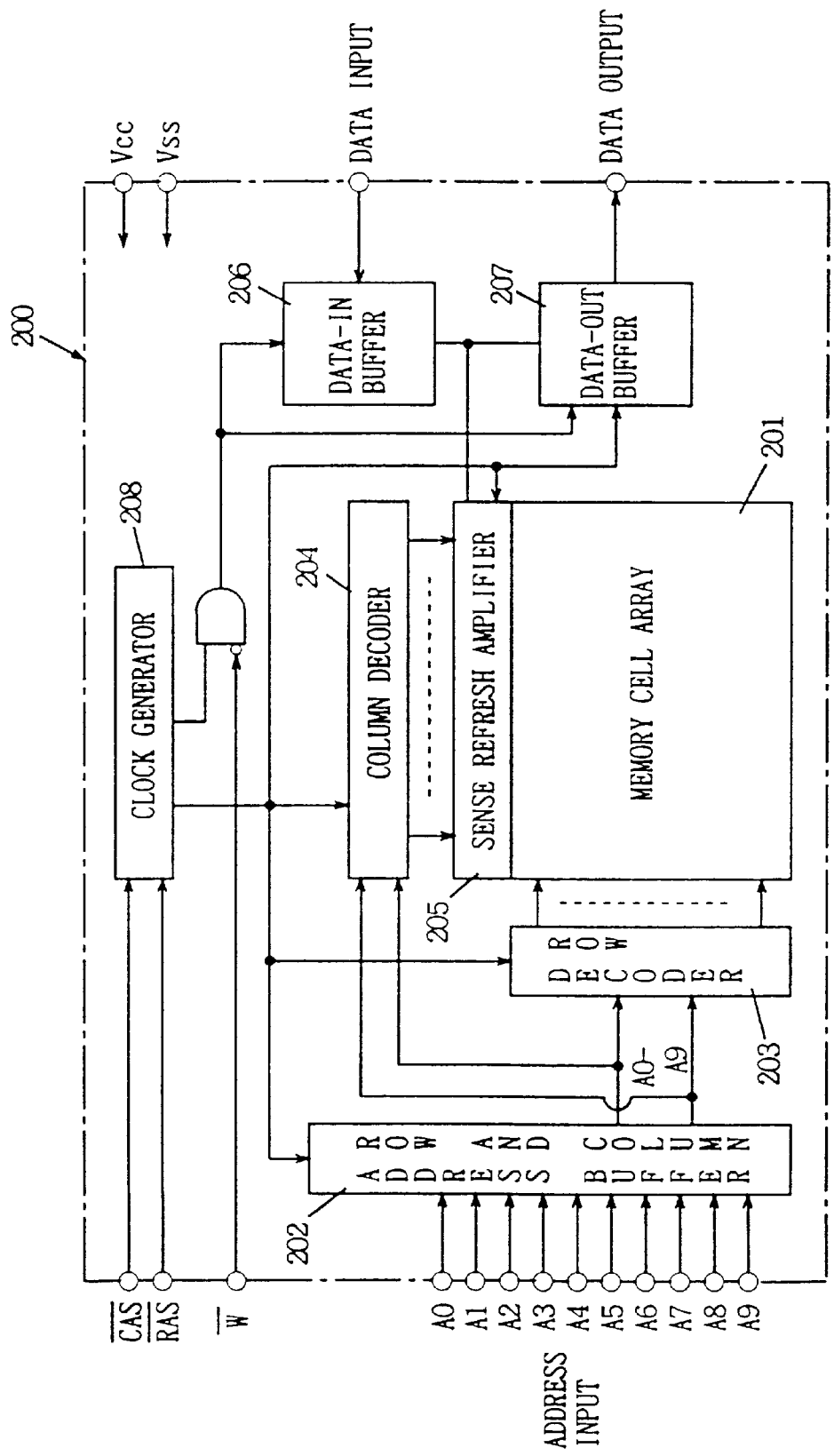
FIG. 1 is a block diagram showing a structure of a DRAM to which the present invention is applied.

FIG. 1 is a block diagram showing a structure of a DRAM to which the present invention is applied.

Referring to FIG. 1, a DRAM 200 includes a memory cell array 201, a row and column address buffer 202, a row decoder 203, a column decoder 204, a sense refresh amplifier 205, a data-in buffer 206, a data-out buffer 207, and a clock generator 208.

Memory cell array 201 serves to store data signals of stored information. Row and column address buffer 202 receives an externally applied address signal for selecting a memory cell forming a unitary storage circuit. Row decoder 203 and column decoder 204 decode an address signal to specify a memory cell.

Sense refresh amplifier 205 amplifies and reads out a signal stored in a specified memory cell. Data-in buffer 206 and data-out buffer 207 input/output data. Clock generator 208 generates a clock signal.

In a semiconductor chip of the above-described DRAM 200, memory cells for storing unitary storage information are arranged in a matrix in memory cell array 201.

Figures 31A, 31B, 31C, 31D, 31E, 31F:
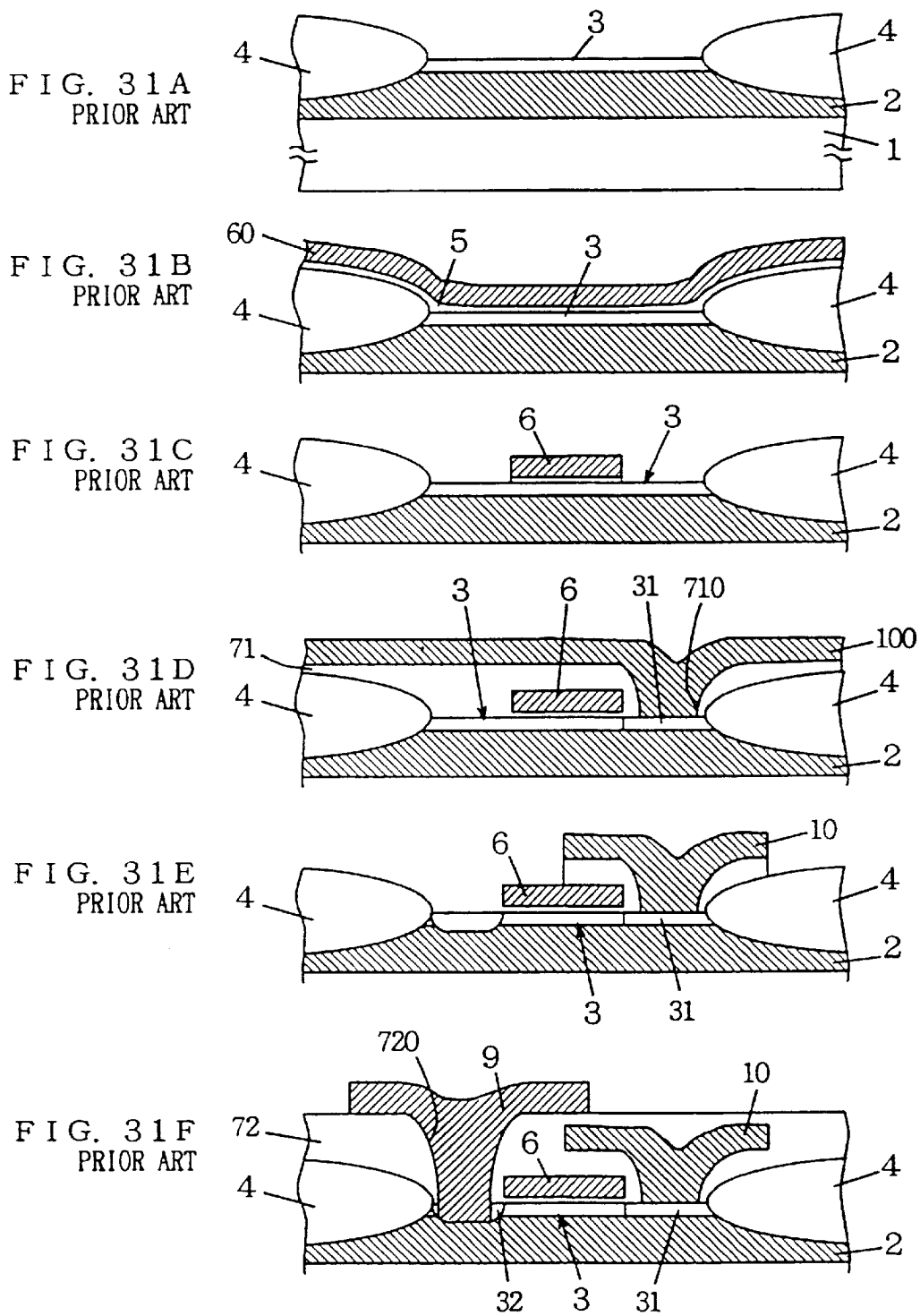
FIGS. 31A–31F are sectional views of a memory cell of a SOI structure showing manufacturing steps for describing problems in manufacturing thereof.

A method of manufacturing a memory cell when a DRAM memory cell is to be formed with an SOI structure will be described hereinafter with reference to FIGS. 2A–2G showing the main steps. Referring to FIGS. 2A and 2B, processes similar to those shown in FIGS. 31A and 31B are carried out. More specifically, an insulating layer 2, an SOI layer 3 of a first conductivity type, and a field oxide film 4 are formed on a semiconductor substrate 1. Then, a gate oxide film 5 and a gate electrode layer 60 are formed.

Referring to FIG. 2C, gate electrode layer 60 and gate oxide film 5 located above one of the pair of impurity regions of SOI layer 3 and the field oxide film 4 adjacent to that one impurity region are removed by etching. Gate electrode layer 60 is partially patterned. As a result, a partial surface of SOI layer 3 is exposed.

Referring to FIG. 2D, ion implantation is carried out on the exposed portion of SOI layer 3, whereby an impurity region 31 of a second conductivity type is formed. Then, an interlayer insulating layer 71 is formed to cover the surface of SOI layer 3, gate electrode layer 60, and field oxide film 4.

Interlayer insulating layer 71 on impurity region 31 is removed by etching to form a contact hole 710. A polysilicon layer 80 is formed on the surface of interlayer insulating layer 71 so as to come into contact with impurity region 31 of SOI layer 3 via contact hole 710.

Referring to FIG. 2E, using a resist pattern of a predetermined configuration as a mask, polysilicon layer 80 is removed by etching except for the portion above and in the proximity of impurity region 31. As a result of the patterning, a polypad 8 is formed.

Referring to FIG. 2F, gate electrode layer 60 on the other impurity region of SOI layer 3 and on the gate oxide film 4 adjacent to the other impurity region is removed by etching, whereby gate electrode layer 60 is patterned.

As a result, gate electrode 6 is formed and a partial surface of SOI layer 3 is exposed.

Referring to FIG. 2G, an interlayer insulating layer 72 is formed so as to cover SOI layer 3, field oxide film 4, gate 6, and polypad 8. Then, interlayer insulating layer 72 located above SOI layer 3 in which the other impurity region is to be formed is removed by etching to form a contact hole 720.

A lower electrode layer of polysilicon is formed on the surface of interlayer insulating layer 72 so as to come into contact with SOI layer 3 via contact hole 720. It is patterned, resulting in a storage node 9. Then, a predetermined thermal treatment is applied, whereby impurities are diffused from storage node 9 into a region of SOI layer 3 thereunder. As a result, an impurity region 32 of a second conductivity type is formed in SOI layer 3.

Although not shown in the above description and in FIGS. 2A–2G, a bit line is formed on polypad 8 before storage node g is formed.

According to a manufacturing method of the first embodiment, when polysilicon layer 80 above gate electrode 6 is to be patterned, gate electrode layer 60 exists beneath the portion to be patterned. At the first step, polysilicon layer 80 and interlayer insulating layer 71 are removed by etching. At the second step, gate electrode layer 60 and gate oxide film 5 are removed by etching. Therefore, the portion of SOI layer 3 where impurity region 32 is formed is impervious to the etching process of polysilicon layer 80.

In the second etching step of gate electrode layer 60 and gate oxide film 5, a small amount from the surface of gate electrode layer 60 to the surface of SOI layer 3 is removed by etching. Therefore, the etching amount can be easily adjusted. The etching progress can easily be stopped at the surface of SOI layer 3.

According to the manufacturing method of a memory cell of the first embodiment, the amount that is removed from SOI layer 3 caused by the etching process of the layer above SOI layer 3 is suppressed.

The present invention is not limited to the manufacturing method of the first embodiment where polysilicon layer 80 which is a conductive layer closest to gate electrode 6 is used for forming polypad 8, and is similarly applicable in the case where polysilicon layer 80 is a layer for forming a bit line.

The method of forming impurity region 31 in the manufacturing process of the memory cell may be carried out by diffusing impurities from polypad 8. Also, impurity region 32 may be formed by ion implantation in the present manufacturing process of the memory cell.

The specific structure of a memory cell manufactured according to the manufacturing method of the first embodiment will be described hereinafter.

Figure 3:
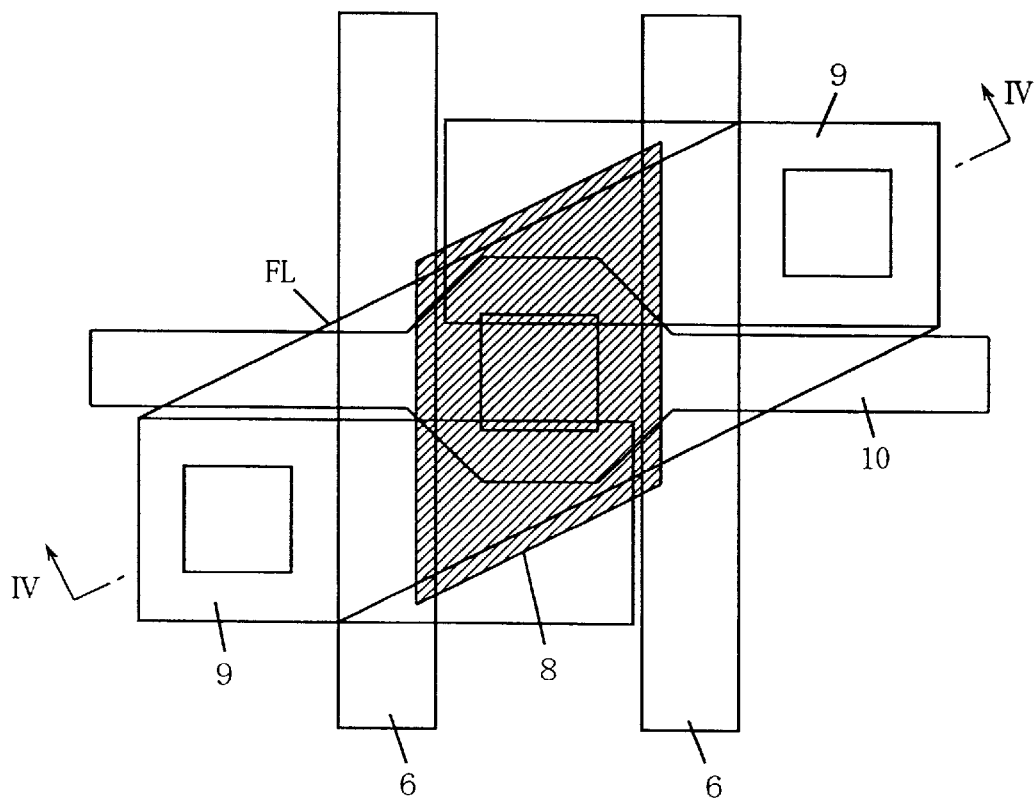
FIG. 3 is a plan view schematically showing a memory cell manufactured by the first embodiment.
Figure 4:
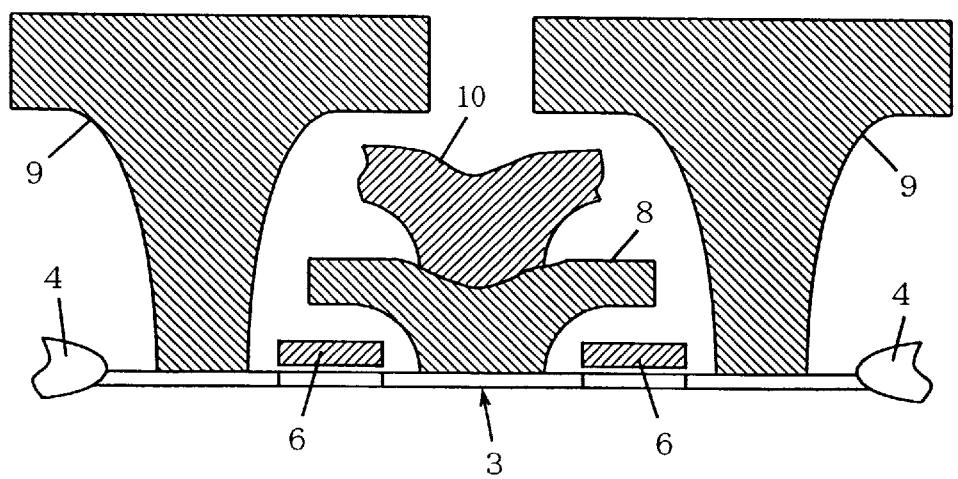
FIG. 4 is a sectional view taken along line A—A of FIG. 3.

FIG. 3 is a plan view schematically showing a memory cell manufactured according to the first embodiment. FIG. 4 is a sectional view thereof taken along line A—A of FIG. 3.

Referring to FIG. 3, gate electrodes 6, 6 form word lines. In a memory cell, a word line and a bit line 10 are disposed so as to cross each other at right angles. More specifically, a word line extends in a row direction, and bit line 10 extends in the column direction. Storage nodes 9, 9 are positioned sandwiching bit line 10. The word lines are positioned sandwiching polypad 8. Element formation region FL is provided in a direction inclined with respect to the word line.

Referring to FIG. 4, a polypad 8, a bit line 10, and a storage node 9 are formed sequentially on gate electrode 6 (word line). Bit line 10 is electrically connected to SOI layer 3 via polypad 8. More specifically, this memory cell is the so called bit line buried structure memory cell.

Second Embodiment

FIGS. 5A–5F are sectional views of a memory cell according to a manufacturing method of a second embodiment.

Referring to FIGS. 5A–5D, processes similar to those shown in FIGS. 2A–2D are carried out.

Figure 5A:
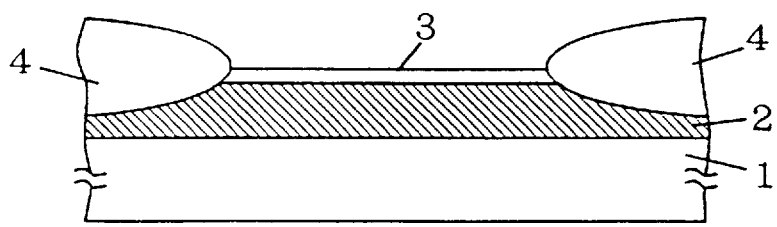
FIGS. 5A–5F are sectional views of a memory cell showing the manufacturing steps in order according to a second embodiment.
Figure 5B:
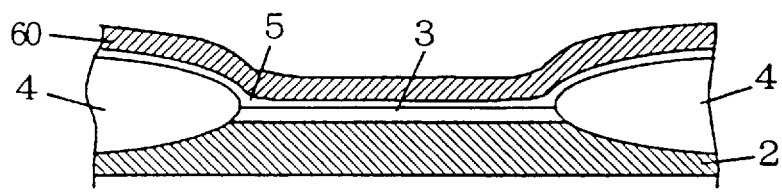
Figure 5C:
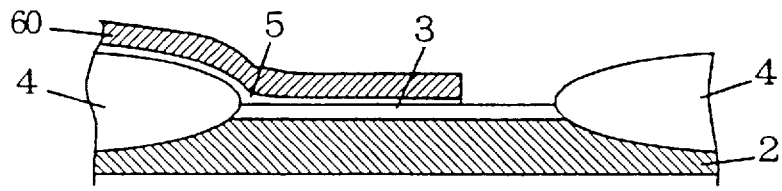
Figure 5D:
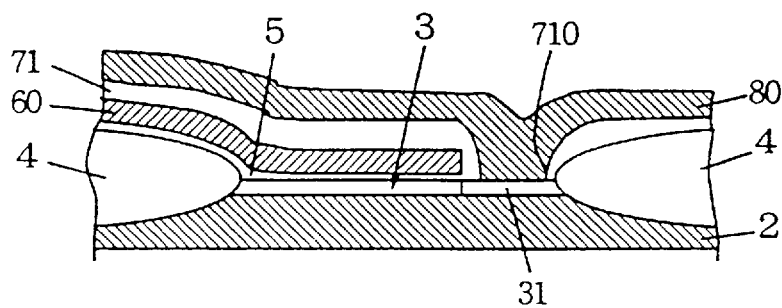
Figure 5E:
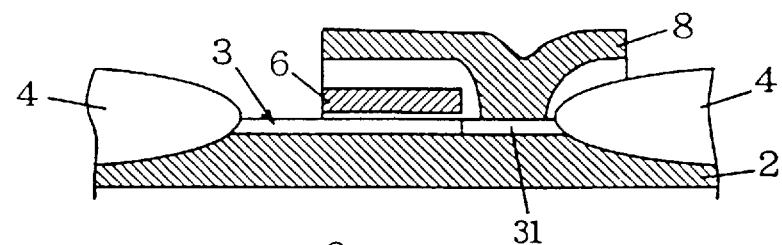

Referring to FIG. 5E, polysilicon layer 80, interlayer insulating layer 71, gate electrode layer 60, and gate oxide film 5 located above the region of SOI layers 3 where the other impurity region (impurity region 32) is to be formed are removed at the same time using a resist pattern of a predetermined configuration.

As a result, polysilicon layer 80 and gate electrode layer 60 are patterned at the same time, resulting in the formation of a polypad 8 and a gate electrode 6 simultaneously.

Figure 5F:
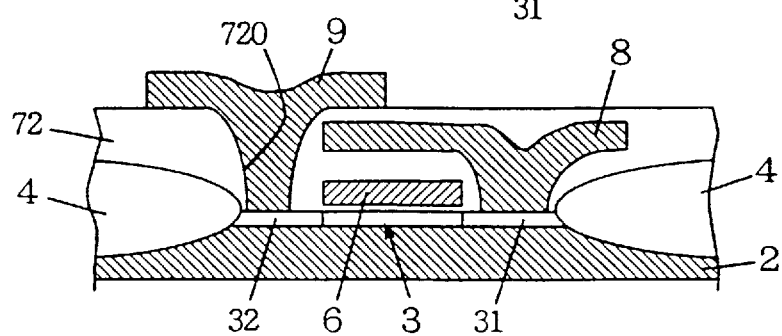

Referring to FIG. 5F, storage node 9 and impurity region 32 are formed in a manner similar to the steps shown in FIG. 2G.

In the manufacturing method of a memory cell according to the second embodiment, gate electrode layer 60 is also etched in the patterning process of polysilicon layer 80 located above gate electrode layer 60. More specifically, polysilicon layer 80, interlayer insulating layer 71, gate electrode layer 60 and gate oxide film 5 are removed by etching at one time.

Therefore, the portion of SOI layer 3 where impurity region 32 is formed is impervious to the etching process of polysilicon layer 80 when the conductive layer thereof is etched. It is only susceptible to the etching process of gate electrode layer 60.

According to the method of manufacturing a memory cell of the second embodiment, the amount that is removed from SOI layer 3 caused by the etching process of the conductive layer above SOI layer 3 is suppressed.

The present invention is not limited to the manufacturing method of the second embodiment where polysilicon layer 80 which is a conductive layer closest to gate electrode 6 is used for forming polypad 8, and is also applicable in the case where polysilicon layer 80 is used for forming a bit line.

Impurity region 31 may be formed by diffusing impurities from polypad 8 in the present manufacturing method of the memory cell. Also, impurity region 32 may be formed by ion implantation.

Third Embodiment

Figures 7A, 7B:
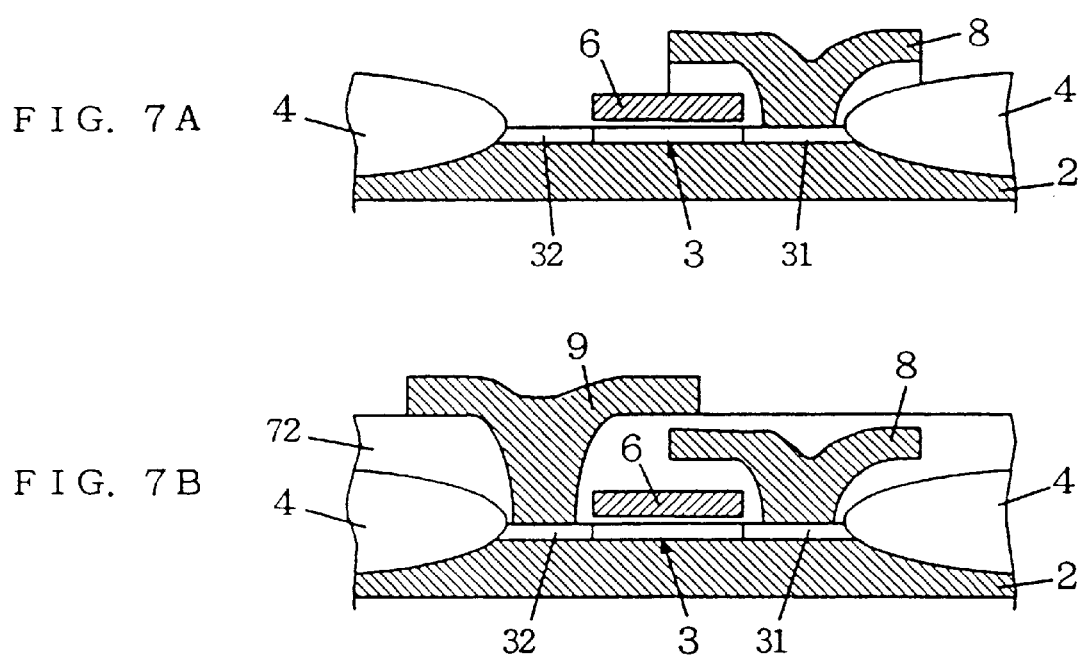

FIGS. 6A–6F and FIGS. 7A and 7B are sectional views of a memory cell formed according to a manufacturing method of a third embodiment. The steps of FIGS. 7A and 7B are subsequent to the steps of FIGS. 6A–6F, all showing the main steps of the manufacturing method.

Referring to FIGS. 6A and 6B, the steps similar to those shown in FIGS. 2A and 2B are carried out.

Referring to FIG. 6C, a resist pattern 61 is formed on the center portion of gate electrode layer 60 above SOI layer 3.

Using resist pattern 61 as a mask, ion implantation is carried out, whereby a pair of impurity regions 31 and 32 of the second conductivity type are simultaneously formed in SOI layer 3.

Ion implantation is carried out by implanting ions at an energy on the order of MeV. Therefore, an impurity region can be formed in SOI layer 3 which is distant from the surface of gate electrode layer 60.

Referring to FIG. 6D, gate electrode layer 60 and gate oxide film 5 located above impurity region 31 and the field oxide film 4 adjacent that impurity region are removed by etching. As a result, gate electrode layer 60 is partially patterned.

Referring to FIG. 6E, an interlayer insulating layer 71 is formed covering the surface of impurity region 31, gate electrode layer 60 and field oxide film 4.

Then, interlayer insulating layer 71 on impurity region 31 is removed by etching to form a contact hole 710. A polysilicon layer 80 is formed on the surface of interlayer insulating layer 71 so as to come into contact with impurity region 31 via contact hole 710.

Referring to FIG. 6F, a process similar to that shown in FIG. 2E is carried out to form a polypad 8.

Referring to FIG. 7A, gate electrode layer 60 on impurity region 32 and gate oxide film 4 adjacent thereto are removed by etching. As a result, gate electrode 60 is patterned to form gate electrode 6, and the surface of impurity region 32 is exposed.

Referring to FIG. 7B, an interlayer insulating layer 72 is formed so as to cover field oxide film 4, impurity region 32, gate electrode 6 and polypad 8. Then, interlayer insulating layer 72 on impurity region 32 is removed by etching to form a contact hole 720.

A lower electrode layer is formed on the surface of interlayer insulating layer 72 so as to come into contact with impurity region 32 via contact hole 720. The lower electrode layer is patterned to form a storage node 9.

Although not shown in the above description, a bit line is formed on polypad 8 before storage node 9 is formed.

According to the present method of manufacturing a memory cell of the third embodiment, impurity regions 31 and 32 of SOI layer 3 are simultaneously formed by ion implantation at an energy on the order of MeV. It is not necessary to form the impurity regions in two steps as in the manufacturing method of a memory cell of the first embodiment. Therefore, the manufacturing process can be simplified.

Fourth Embodiment

FIGS. 8A–8G are sectional views of a memory cell according to a manufacturing method of a fourth embodiment.

Referring to FIGS. 8A–8C, steps similar to those shown in FIG. 2A–2C are carried out.

Referring to FIG. 8D, an interlayer insulating layer 71 is formed covering the surface of SOI layer 3, gate electrode layer 60, and field oxide film 4. Interlayer insulating layer 71 above the portion of SOI layer 3 exposed in the step shown in FIG. 8C is removed by etching to form a contact hole 710.

A lower electrode layer 90 of polysilicon is formed so as to come into contact with SOI layer 3 via contact hole 710 and so as to cover the surface of interlayer insulating layer 71. Then, a predetermined thermal treatment is carried out, whereby impurities are diffused from lower electrode layer 90 into SOI layer 3. As a result, an impurity region 32 is formed in SOI layer 3.

Referring to FIG. 8E, using a resist pattern of a predetermined configuration (not shown) as a mask, lower electrode layer 90 and interlayer insulating film 71 are removed by etching except for the portion above and in the vicinity of impurity region 32. As a result, lower electrode layer 90 is patterned to form storage node 9.

Referring to FIG. 8F, gate electrode layer 60 and gate oxide film 5 above the portion of SOI layer 3 where the other impurity region (impurity region 31) is formed and above field oxide film 4 adjacent to the other impurity region are removed by etching to pattern gate electrode layer 60.

As a result, a gate electrode 6 is formed, and a surface of SOI layer 3 is exposed.

Referring to FIG. 8G, an impurity region 31 is formed by ion implantation into the exposed SOI layer 3. Then, an interlayer insulating layer 72 is formed to cover field oxide film 4, impurity region 31, gate electrode 6 and storage node 9. Interlayer insulating layer 72 on impurity region 31 of SOI layer 3 is removed by etching to form a contact hole 720.

A polysilicon layer 80 is formed in contact with SOI layer 3 via contact hole 720, and covering the surface of interlayer insulation layer 72. Polysilicon layer 80 is patterned to result in a polypad 8. Although not shown in FIG. 8G, a bit line is formed on polypad 8.

According to the present method of manufacturing a memory cell of the fourth embodiment, when lower electrode layer 90 which is a conductive layer closest to gate electrode 6 is patterned, a gate electrode layer 60 exists below the portion to be patterned.

Then at a first step, lower electrode layer 90 and interlayer insulating layer 71 are removed by etching. At a second step, gate electrode layer 60 and gate oxide film 5 are removed by etching. Therefore, the portion of SOI layer 3 where impurity region 32 is formed is impervious to the etching process of lower electrode layer 90.

In the second etching step of gate electrode layer 60 and gate oxide film 5, a small amount from the surface of gate oxide film 60 to the surface of SOI layer 3 is removed by etching. Therefore, the amount of etching can easily be adjusted. Therefore, the etching progress can easily be stopped at the surface of SOI layer 3.

According to the present method of manufacturing the memory cell of the fourth embodiment, the amount that is removed from SOI layer 3 caused by etching of a conductive layer above SOI layer 3 can be suppressed.

The present invention is not limited to the manufacturing method of a memory cell according to the fourth embodiment where polypad 8 is formed on impurity region 31 of SOI layer 3, and a bit line may directly be formed on impurity region 31.

Impurity region 31 may be formed by diffusing impurities from polysilicon layer 80 in the present manufacturing method of a memory cell. Also, impurity region 32 may be formed by ion implantation in the present manufacturing method of a memory cell.

A specific structure of a memory cell manufactured according to the present manufacturing method of the fourth embodiment will be described hereinafter.

Figure 9:
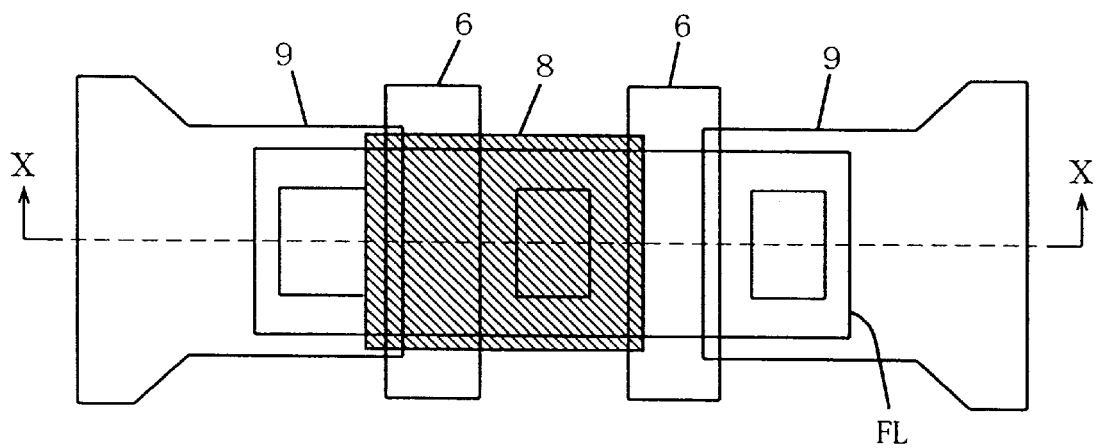
FIG. 9 is a plan view of a memory cell manufactured according to the manufacturing method of the fourth embodiment.

Referring to FIG. 9, gate electrodes 6, 6 form word lines. In a memory cell, a word line and a bit line (not shown) are disposed so as to cross each other at right angles. More specifically, a word line extends in a row direction, and a bit line extends in a column direction. Storage node 9, 9 are positioned sandwiching a word line. Two word lines are positioned sandwiching a polypad 8. An element formation region FL is provided parallel to the bit line.

Figure 10:
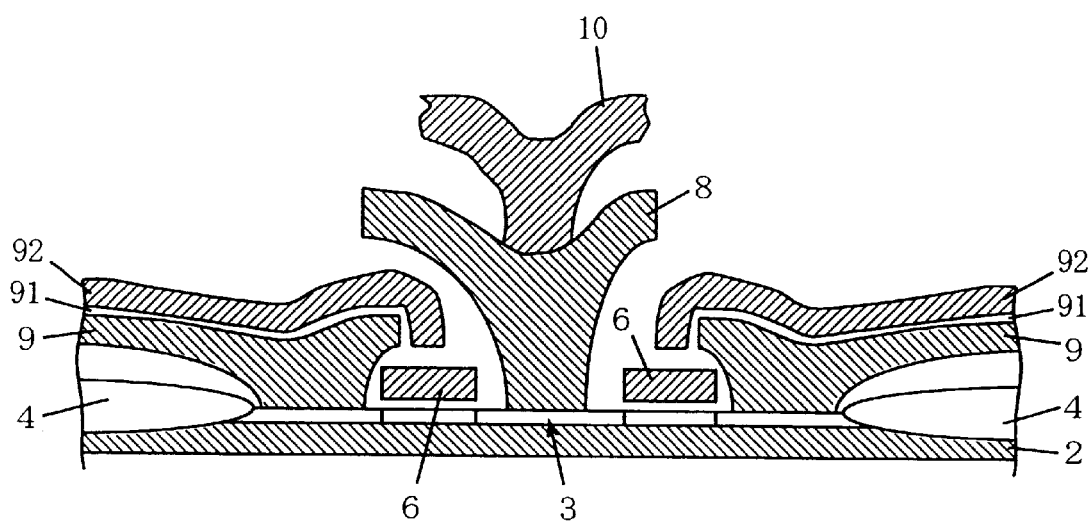
FIG. 10 is a sectional view taken along line B—B of FIG. 9.

Referring to FIG. 10, above gate electrode 6 (word line), storage node 9, dielectric layer 91, cell plate 92, polypad 8, and bit line 10 are provided in an ascending order. Bit line 10 is connected to SOI layer 3 via polypad 8. In other words, this memory cell has the so called stacked type capacitor. As described in the third embodiment, impurity regions of the SOI layer may be formed simultaneously by ion implantation at an energy on the order of MeV in manufacturing a memory cell of the structure of the fourth embodiment.

Fifth Embodiment

FIGS. 11A–11F are sectional views of a memory cell manufactured according to a method of a fifth embodiment.

Referring to FIGS. 11A–11D, steps similar to those shown in FIGS. 8A–8D are carried out.

Figure 11A:
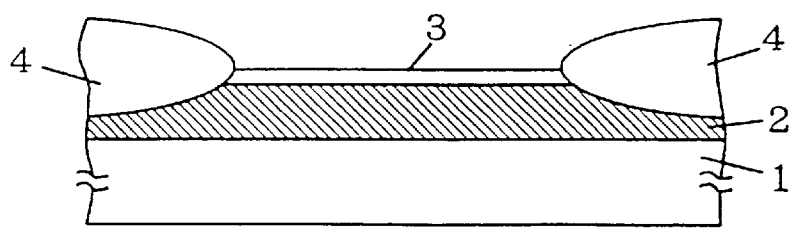
FIGS. 11A–11F are sectional views of a memory cell showing manufacturing steps in order according to a fifth embodiment.
Figure 11B:
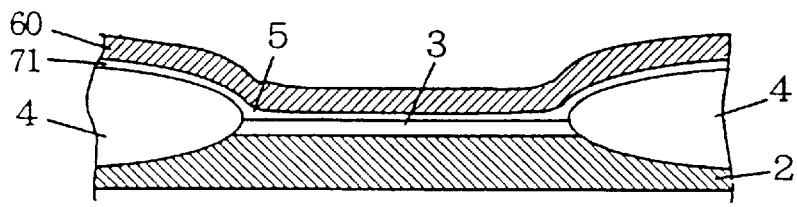
Figure 11C:
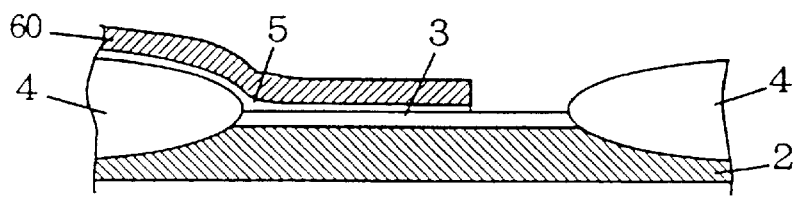
Figure 11D:
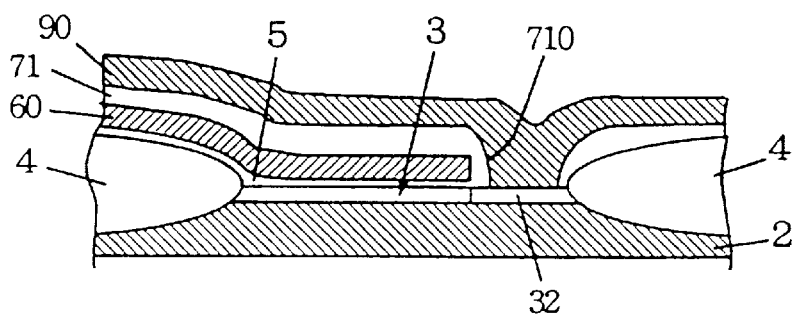
Figure 11E:
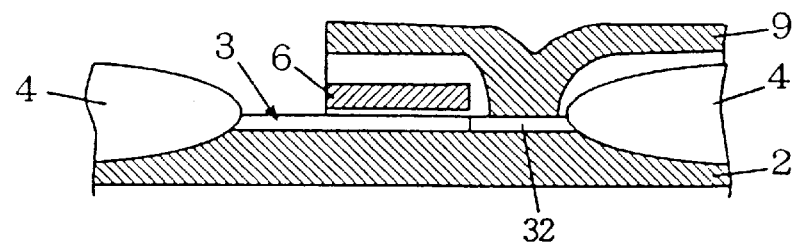

Referring to FIG. 11E, lower electrode layer 90, interlayer insulating layer 71, gate electrode layer 60 and gate oxide film 5 located above the portion of SOI layer 3 where the other impurity region (impurity region 31) is formed are removed by etching at one time using a resist pattern of a predetermined configuration. As a result, lower electrode layer 90 and gate electrode layer 60 are patterned. Thus, storage node 9 and gate electrode 6 are formed.

Figure 11F:
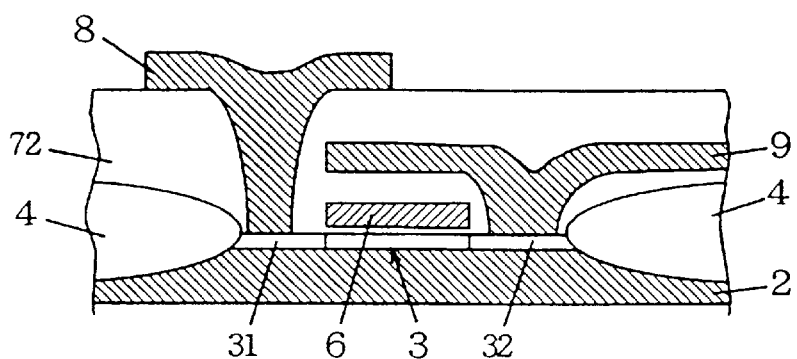

Referring to FIG. 11F, an impurity region 31, an interlayer insulating layer 72, and a polypad 8 are formed according to a step similar to the step shown in FIG. 8G.

According to the present method of manufacturing a memory cell of the fifth embodiment, when lower electrode layer 90 which is the conductive layer closest to gate electrode layer 60 is patterned, gate electrode layer 60 is also etched away. More specifically, lower electrode layer 90, interlayer insulating layer 71, gate electrode layer 60 and gate oxide film 5 are removed by etching at the same time.

Therefore, the portion of SOI layer 3 where impurity region 31 is formed is impervious to the etching process of lower electrode layer 90 in the etching step of the conductive layer. It is only susceptible to the etching process of gate electrode layer 60.

According to the present manufacturing method of a memory cell of the fifth embodiment, the amount that is removed from SOI layer 3 caused by etching of a conductive layer above SOI layer 3 is suppressed.

Sixth Embodiment

FIGS. 12A–12G and FIGS. 13A–13C subsequent thereto are sectional views of a memory cell manufactured according to the method of a sixth embodiment.

Referring to FIGS. 12A–12F, steps similar to those of FIGS. 2A–2F are carried out.

Figure 12A:
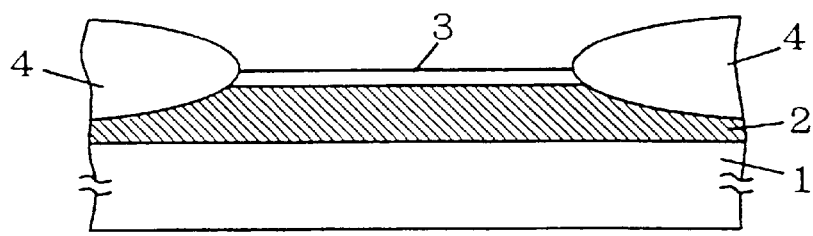
FIGS. 12A–12G and FIGS. 13A–13C are sectional views of a memory cell showing manufacturing steps in order according to a sixth embodiment.
Figure 12B:
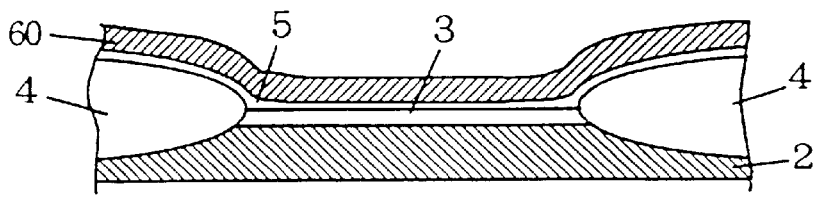
Figure 12C:
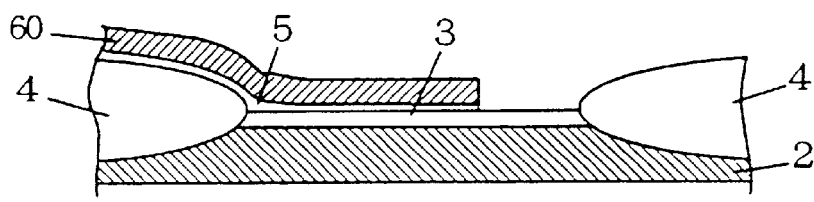
Figure 12D:
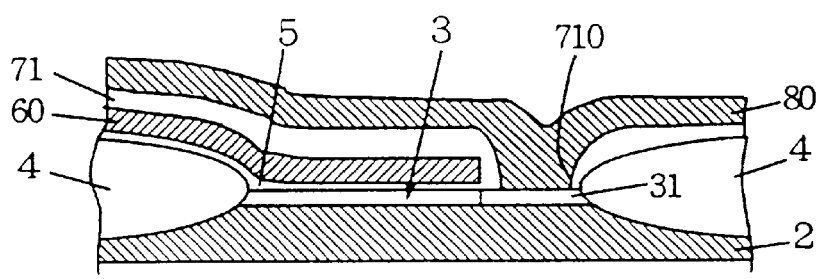
Figure 12E:
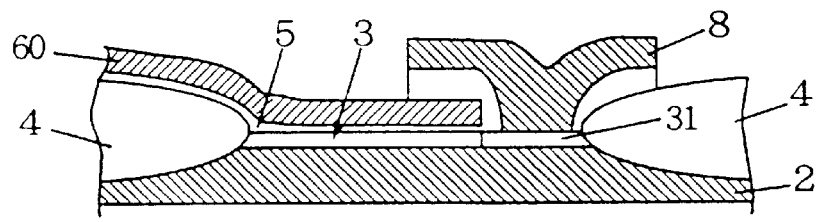
Figure 12F:
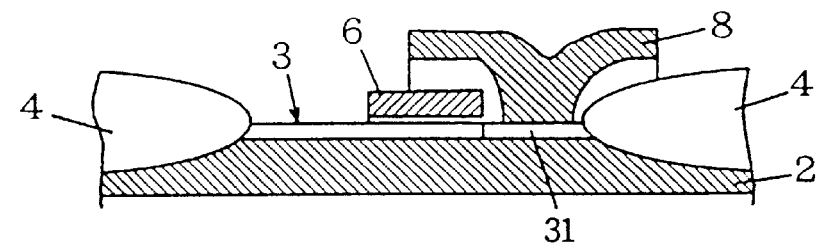
Figure 12G:
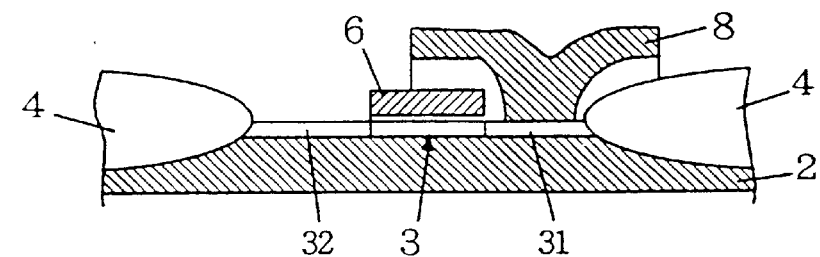

Referring to FIG. 12G, an impurity region 32 is formed in SOI layer 3 by ion implantation.

Figure 13A:
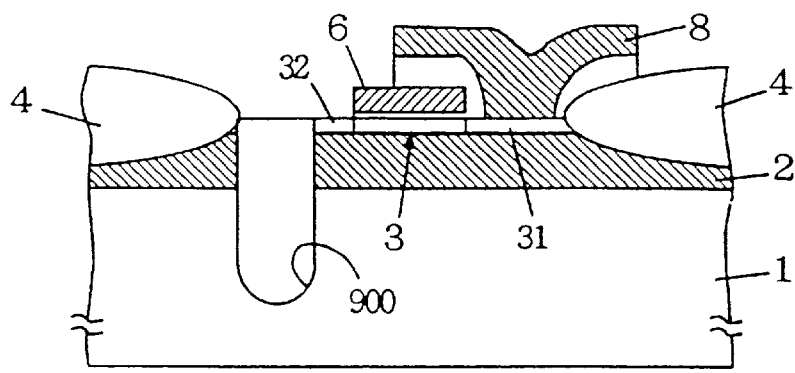

Referring to FIG. 13A, a trench 900 is formed piercing impurity region 32 of SOI layer 3 and insulating layer 2 and arriving in silicon substrate 1.

Figure 13B:
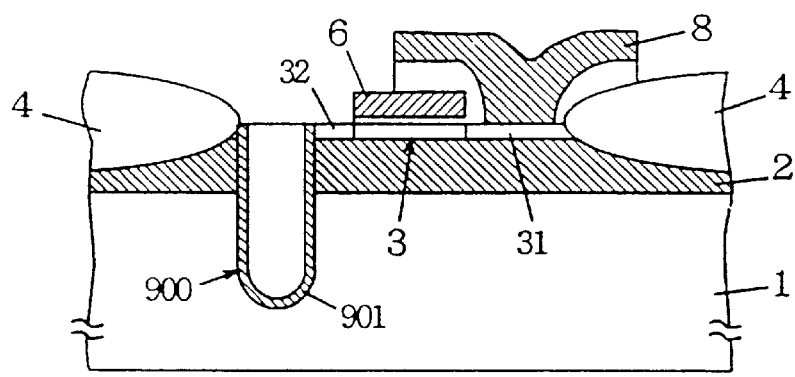

Referring to FIG. 13B, a storage node 901 is formed at the inside surface of trench 900.

Figure 13C:
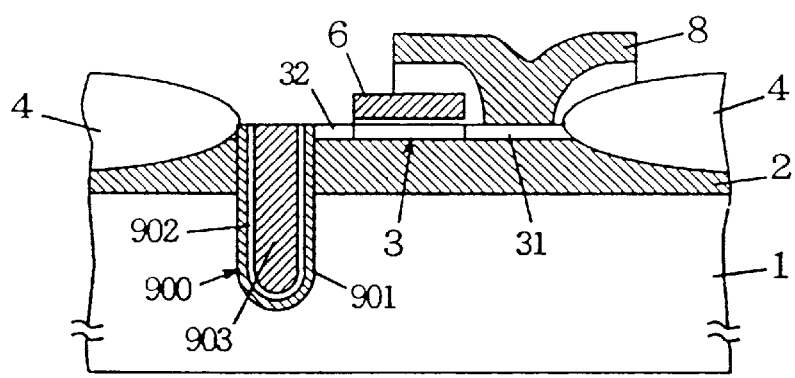

Referring to FIG. 13C, a dielectric 902 is formed on the inside surface of storage node 901. The spacing inside dielectric 902 is filled with a cell plate 903.

Although not shown in the above description, a bit line is formed on polypad 8 in the present memory cell.

Figure 14:
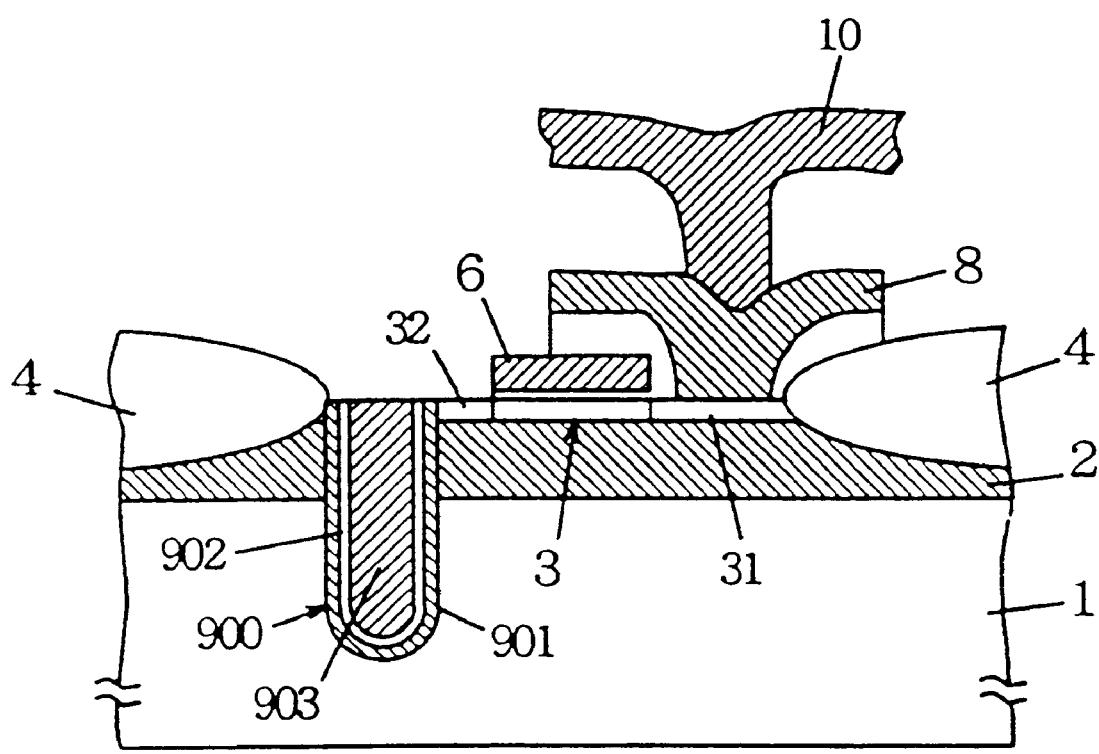
FIG. 14 is a sectional view of a memory cell manufactured by the manufacturing method according to the sixth embodiment.

FIG. 14 is a sectional view of a memory cell manufactured according to the method of the sixth embodiment.

Referring to FIG. 14, gate electrode 6 functions as a word line in the present memory cell. Storage node 900, dielectric film 901 and cell plate 902 form a trench type capacitor. In other words, this memory cell has a trench type capacitor.

According to the present manufacturing method of a memory cell of the sixth embodiment, the manufacturing method of a memory cell of the first embodiment where polysilicon layer 80, interlayer insulating layer 71, gate electrode layer 60 and gate oxide film 5 are etched in two stages can be applied to a method of manufacturing a memory cell having a trench type capacitor.

Therefore, the amount that is removed from an SOI layer can be suppressed in manufacturing a memory cell using an SOI structure having a trench type capacitor in an DRAM.

Seventh Embodiment

FIGS. 15A–15F and FIGS. 16A–16C subsequent thereto are sectional views of a memory cell according to a manufacturing step of a seventh embodiment.

Referring to FIGS. 15A–15E, steps similar to those shown in FIGS. 5A–5E are carried out.

Figure 15A:
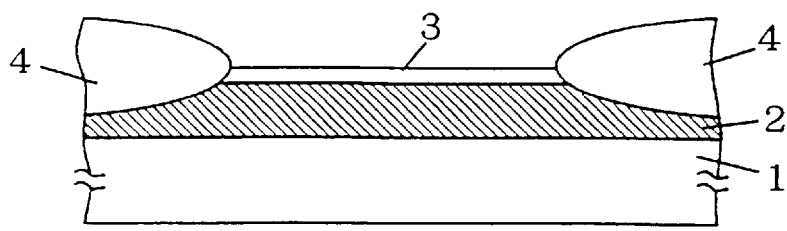
FIGS. 15A–15F and FIGS. 16A–16C are sectional views of a memory cell showing the manufacturing steps in order according to a seventh embodiment.
Figure 15B:
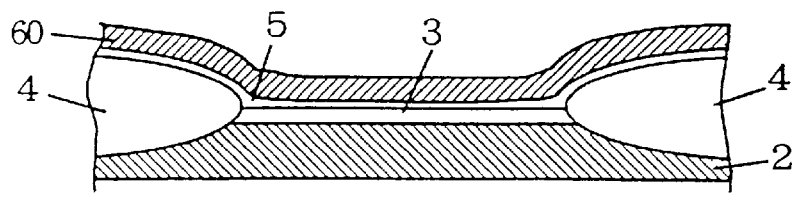
Figure 15C:
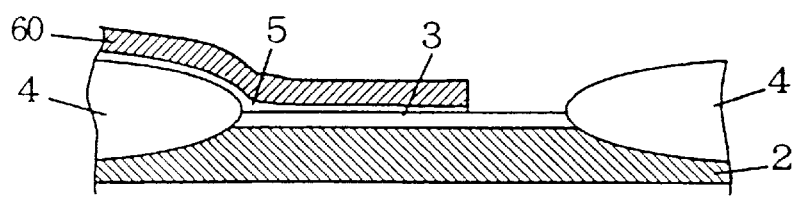
Figure 15D:
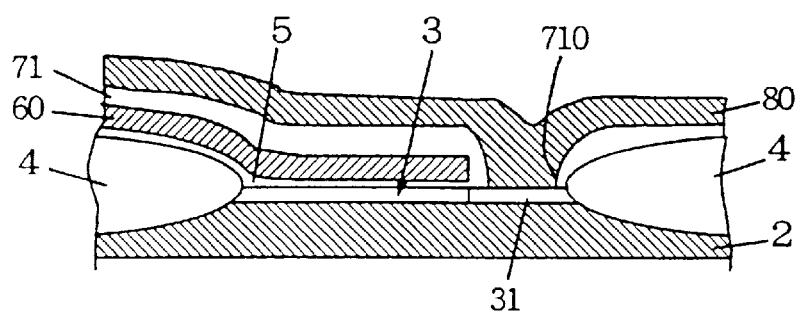
Figure 15E:
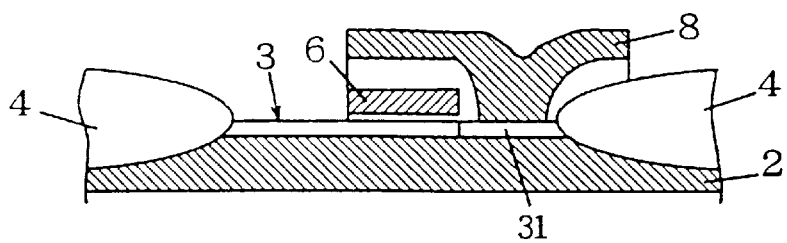
Figure 15F:
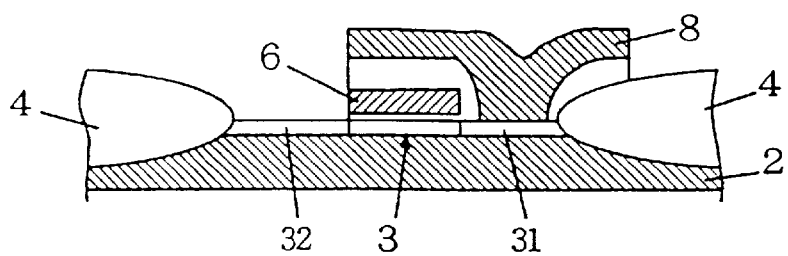

Referring to FIG. 15F, an impurity region 32 is formed in an SOI layer 3 by ion implantation.

Figure 16A:
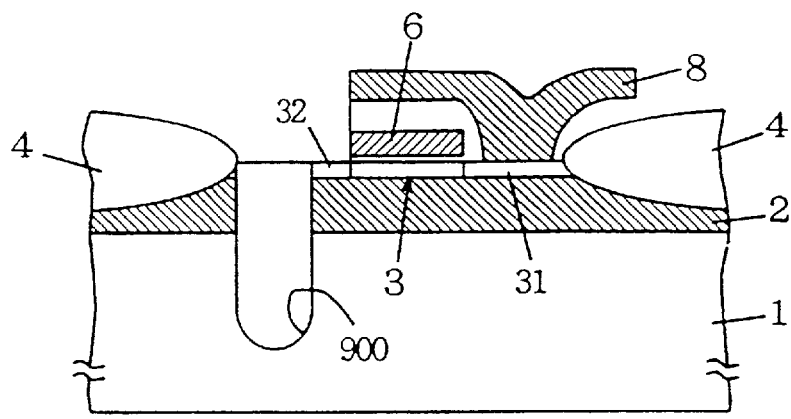

Referring to FIG. 16A, a trench 900 is formed through impurity region 32 of SOI layer 3 and insulating layer 2 arriving into silicon substrate 1.

Figure 16B:
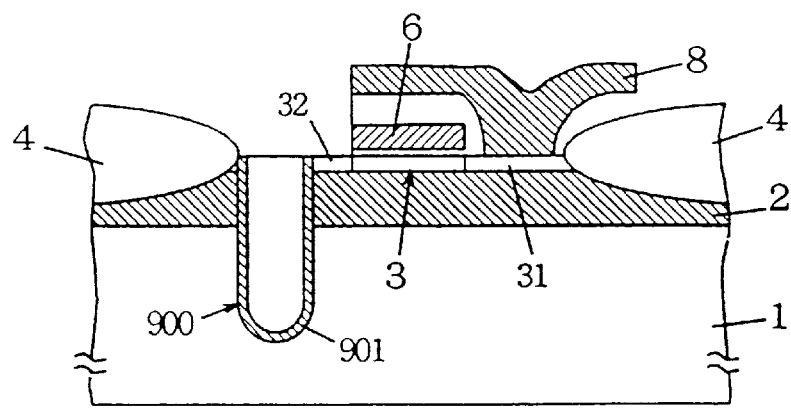

Referring to FIG. 16B, a storage node 901 is formed at the inside surface of trench 900.

Figure 16C:
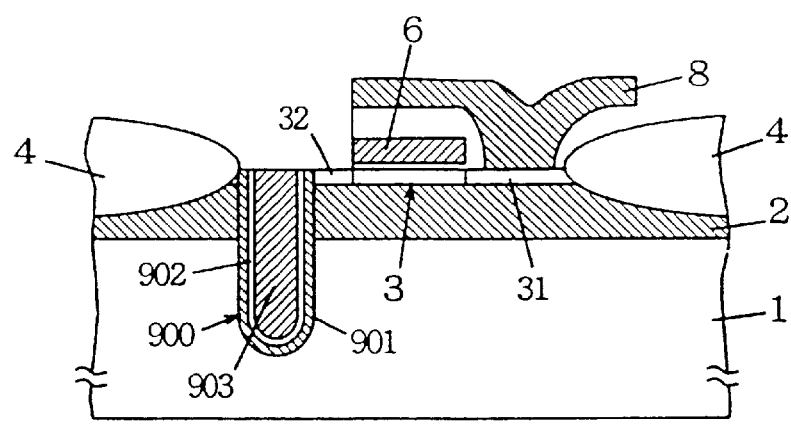
Figure 17A:
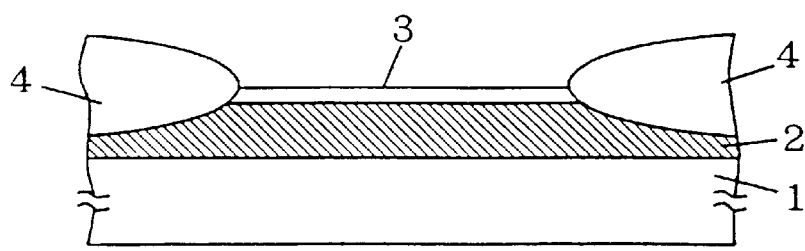
FIGS. 17A–17F and FIGS. 18A–18D are sectional views of a memory cell showing the manufacturing steps in order according to an eighth embodiment.
Figure 17B:
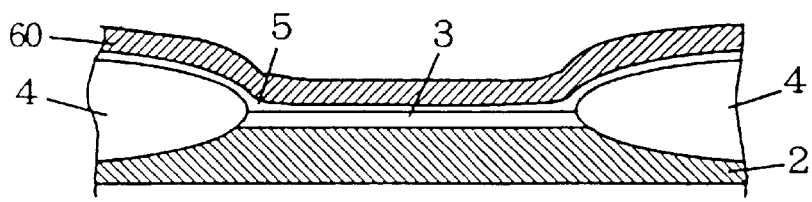
Figure 17C:
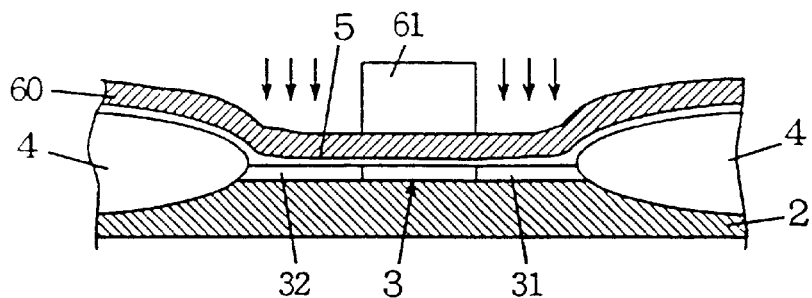
Figure 17D:
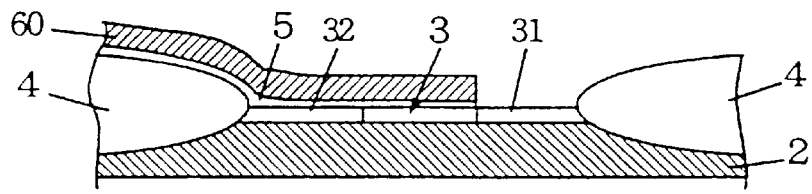
Figure 17E:
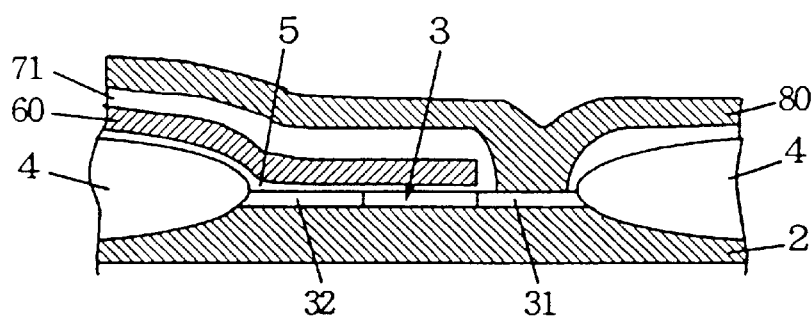
Figure 17F:
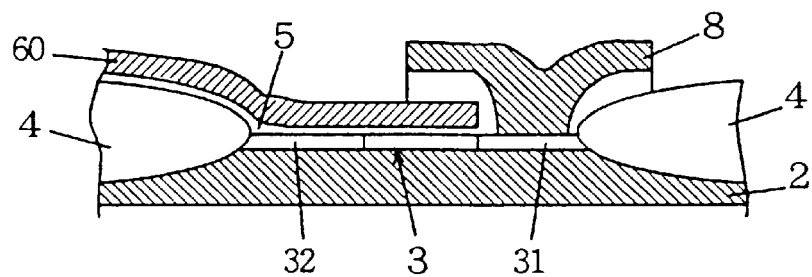

Referring to FIG. 16C, a dielectric film 902 is formed at the inside surface of storage node 901. Then, a cell plate 903 is formed so as to fill the spacing inside dielectric film 902.

According to the present manufacturing method of a memory cell of the seventh embodiment, a memory cell is manufactured using an SOI structure having a trench type capacitor similar to that of the sixth embodiment is formed.

According to the present manufacturing method of a memory cell of the seventh embodiment, the manufacturing method of a memory cell according to the second embodiment where polysilicon layer 80, interlayer insulating layer 71, gate electrode layer 60 and gate oxide film 5 are etched by one step can be applied to the method of manufacturing a memory cell having a trench type capacitor.

Therefore, the amount that is removed from an SOI layer can be suppressed in manufacturing a memory cell using an SOI structure having a trench type capacitor of a DRAM.

Eighth Embodiment

FIGS. 17A–17F and FIGS. 18A–18D subsequent thereto are sectional views of a memory cell showing manufacturing steps thereof according to an eighth embodiment.

Referring to FIGS. 17A–17F, steps similar to those shown in FIGS. 6A–6F are carried out.

Figure 18A:
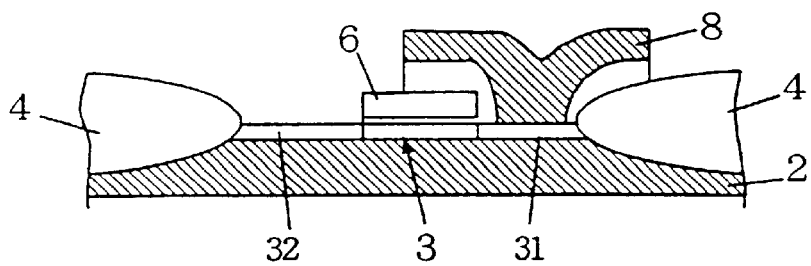

Referring to FIG. 18A, a step similar to that shown in FIG. 7A is carried out.

Figure 18B:
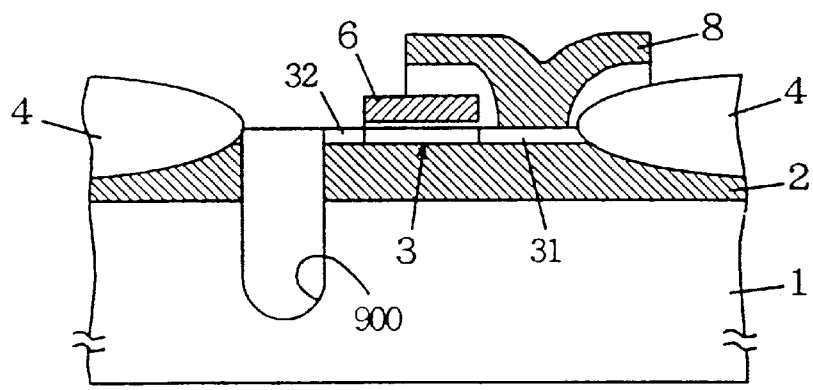

Referring to FIG. 18B, a trench 900 is formed through impurity region 32 of SOI layer 3 and insulating layer 2 arriving to silicon substrate 1.

Figure 18C:
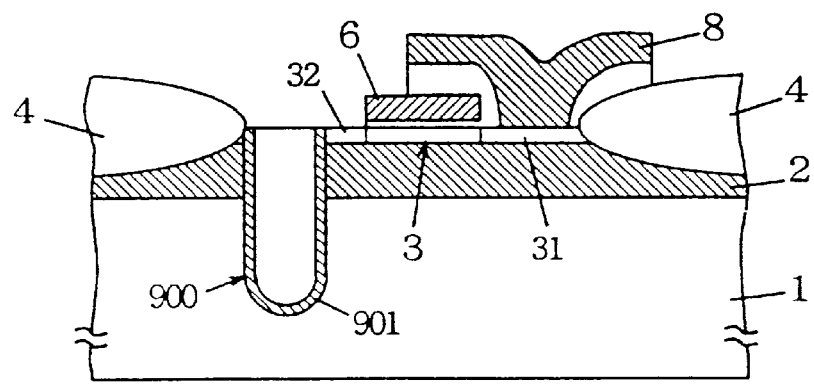

Referring to FIG. 18C, a storage node 901 is formed at the inside surface of trench 900.

Figure 18D:
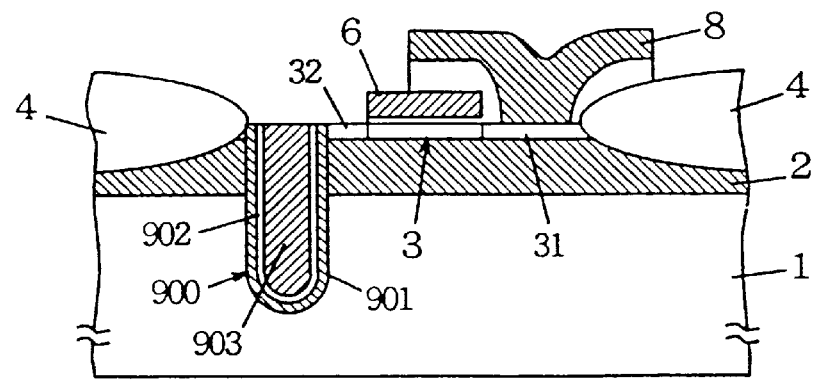

Referring to FIG. 18D, a dielectric film 902 is formed at the inside surface of storage node 901. Then, a cell plate 903 is formed so as to fill the spacing at the inner side of dielectric film 902.

According to the present manufacturing method of a memory cell of the eighth embodiment, a memory cell having a trench type capacitor is formed.

According to the present manufacturing method of a memory cell of the eighth embodiment, the manufacturing method of a memory cell according to the third embodiment where impurity regions 31 and 32 are formed simultaneously by ion implantation at an energy on the order of MeV, followed by a two-etching step of polysilicon layer 80, interlayer insulating layer 71, gate electrode layer 60, and gate oxide film 5 is applicable to the method of manufacturing a memory cell having a trench type capacitor.

Therefore, the amount that is removed from an SOI layer can be suppressed in manufacturing a memory cell utilizing an SOI layer having a trench type capacitor in a DRAM.

Ninth Embodiment

In the above first to eighth embodiment, a method of manufacturing a memory cell utilizing an SOI structure in a DRAM was described. In the ninth embodiment, a method of manufacturing a peripheral circuit utilizing an SOI structure in a DRAM will be described hereinafter.

Figure 19:
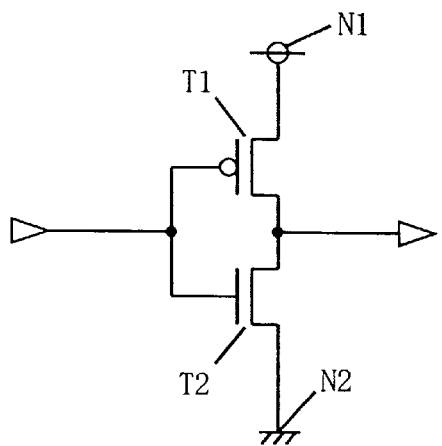
FIG. 19 is a circuit diagram of a CMOS inverter.

An exemplary circuit used in peripheral circuitry is a CMOS inverter. FIG. 19 is a circuit diagram of a CMOS inverter.

Referring to FIG. 19, a CMOS inverter includes a PMOS transistor T1 and an NMOS transistor T2. Transistors T1 and T2 are connected in series between a power supply node N1 receiving power supply potential and a ground node N2 receiving ground potential. The respective gates of transistors T1 and T2 receive input signals. The node between transistors T1 and T2 implement an output node, from which an output signal is provided.

Figure 20:
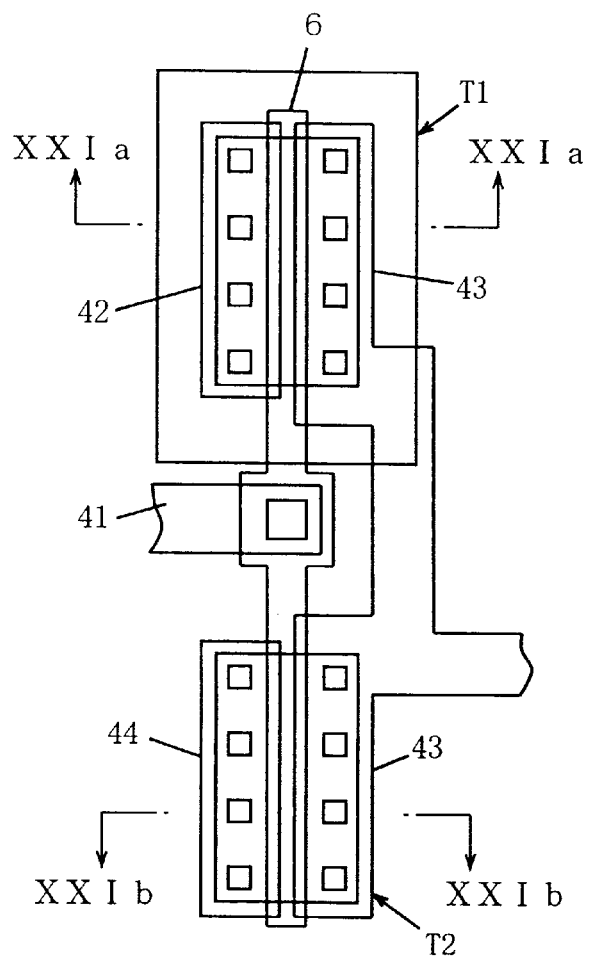
FIG. 20 is a plan view schematically showing a CMOS inverter.
Figure 30:
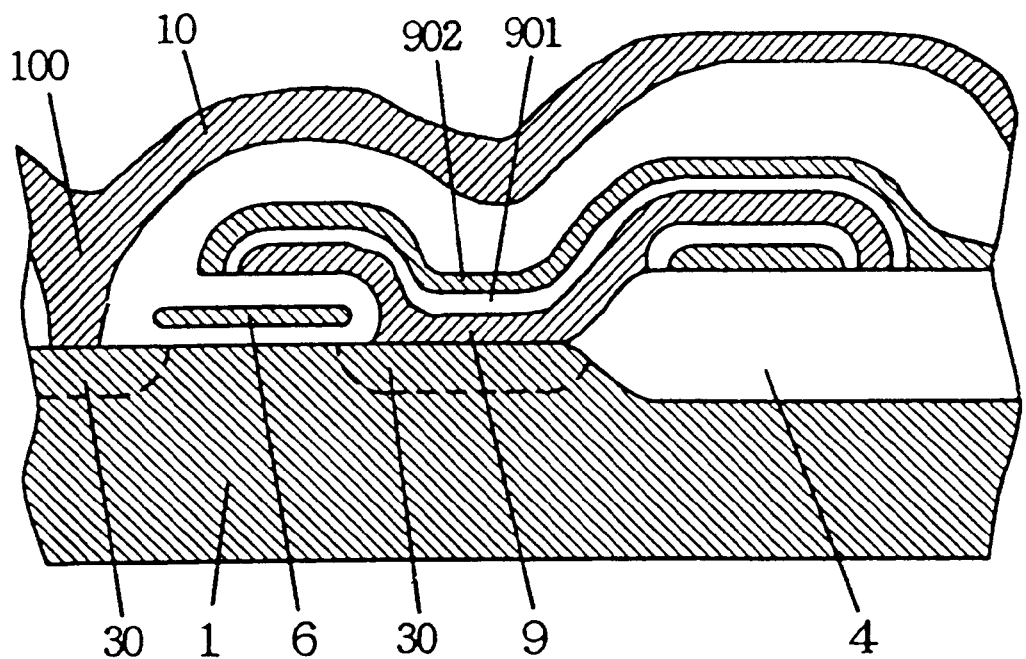
FIG. 30 is a sectional view of a general DRAM memory cell.

FIG. 20 is a plan view schematically showing a CMOS inverter.

Referring to FIG. 20, a gate 6 extends in predetermined direction. A PMOS transistor T1 and an NMOS transistor T2 are provided at either sides in the longitudinal direction of gate 6. Gate 6 is connected to an input interconnection layer 41.

In PMOS transistor T1, one conductive layer 42 forms a power supply node, and the other conductive layer 43 forms an output node. In NMOS transistor T2, one conductive layer 44 forms a ground node, and the other conductive layer 43 forms an output node.

A method of manufacturing the CMOS inverter shown in FIGS. 19 and 20 will be described hereinafter.

FIGS. 21A–21G are sectional views of a CMOS inverter according to the ninth embodiment showing manufacturing steps thereof.

In FIGS. 21A–21G, the left side figures show PMOS transistor T1 taken along line C—C of FIG. 20 and the right side figures show NMOS transistor T2 taken along line D—D of FIG. 20.

Referring to FIGS. 21A–21C, steps similar to those shown in FIGS. 2A–2C are carried out.

Referring to FIG. 21D, ion implantation is carried out, whereby an impurity region 31p is formed in SOI layer 3 for PMOS transistor T1, and an impurity region 31n is formed in SOI layer 3 for NMOS transistor T2. Impurity region 31p is formed by implanting boron ions, and impurity region 31A is formed by implanting arsenic ions.

In each of PMOS transistor T1 and NMOS transistor T2, an interlayer insulating layer 71 covering the surface of gate electrode layer 60 and field oxide film 4 is formed.

Interlayer insulation layer 71 on each of impurity regions 31p and 31n is removed by etching to form contact holes 710 and 710, respectively. Then, a polysilicon layer 80 is formed so as to come into contact with impurity regions 31p and 31n of SOI layer 3 via contact holes 710, and 710, respectively, and so as to cover the surface of interlayer insulating layer 71.

Referring to FIG. 21E, a step similar to that shown in FIG. 2E is carried out for each of PMOS and NMOS transistors T1 and T2. As a result, polypad 8 and 8 are formed on impurity regions 31p and 31n, respectively.

Referring to FIG. 21F, a step similar to that shown in FIG. 2F is carried out for each of PMOS and NMOS transistors T1 and T2. As a result, a gate electrode 6 is formed, and the surface of SOI layer 3 is exposed.

Referring to FIG. 21G, a step similar to that shown in FIG. 2G is carried out for each of PMOS and NMOS transistors T1 and T2. During this process, a conductive layer 43 of polysilicon is formed instead of storage node 9 of FIG. 2G in each of PMOS and NMOS transistors T1 and T2.

By diffusion of impurities from conductive layer 43, an impurity region 32p and an impurity region 32n is formed in SOI layer 3 for PMOS transistor T1 and NMOS transistor T2, respectively.

In the CMOS inverter of FIG. 21 manufactured as described above, polypad 8 of PMOS transistor T1 is provided at the power supply node side, and polypad 8 of NMOS transistor T2 is provided at the ground node side. Respective conductive layers 43 in PMOS and NMOS transistors T1 and T2 form an output node.

Therefore, according to the present method of manufacturing a CMOS inverter of FIGS. 21A–21G, the amount that is removed from SOI layer 3 can be suppressed. Because the CMOS inverter manufactured according to the present method has polypads 8 provided at the power supply node side and the ground node side, reduction in the speed of a circuit operation caused by provision of a polypad 8 is reduced. Such a CMOS inverter can be applied to a circuit where high speed operation of a row decoder or a column decoder, for example, is required.

Tenth Embodiment

FIGS. 22A–22F are sectional views of a CMOS inverter according to a tenth embodiment.

Referring to FIG. 22A–22D, steps similar to those shown in FIGS. 21A–21D are carried out.

Referring to FIG. 22E, a step similar to that shown in FIG. 5E is carried out for each of PMOS and NMOS transistors T1 and T2. As a result, poly pads 8 and 8 are formed on impurity region 31p and 31n, respectively. Also, gate electrodes 6 and 6 are formed.

Referring to FIG. 22F, a step similar to that shown in FIG. 21G is carried out. As a result, a conductive layer 43 of polysilicon is formed. For PMOS transistor T1, an impurity region 32p is formed in SOI layer 3, and for NMOS transistor T2, an impurity region 32n is formed in SOI layer 3.

The CMOS inverter of FIGS. 22A–22F manufactured as described above has polypad 8 of PMOS transistor T1 provided at the power supply node side, and polypad 8 of NMOS transistor T2 provided at the ground node side, similar to the CMOS inverter of FIGS. 21A–21G. Conductive layers 43 and 43 of PMOS and NMOS transistors T1 and T2 form output nodes.

According to the present manufacturing method of a CMOS inverter of FIGS. 22A–22F, the amount that is removed from SOI layer 3 can be suppressed, as the CMOS inverter of FIG. 21A–21F. The CMOS inverter manufactured according to the method shown in FIGS. 22A–22F can be applied to a circuit where high speed operation for a row decoder or a column decoder is required in a DRAM, similar to the CMOS inverter of the ninth embodiment.

Eleventh Embodiment

FIGS. 23A–23H are sectional views of a CMOS inverter according to a manufacturing method of an eleventh embodiment.

Referring to FIGS. 23A and 23B, steps similar to those shown in FIGS. 21A and 21B are carried out.

Referring to FIG. 23C, a resist pattern 61 is formed on the center portion of gate electrode 60 above SOI layer 3 for each of PMOS transistor T1 and NMOS transistor T2.

Using resist pattern 61 as a mask, ion implantation at an energy on the order of MeV is carried out. In this ion implantation, impurity regions 31p and 32p are formed in SOI layer 3 by implanting boron ions for PMOS transistor T1, and impurity regions 31n and 32n are formed in SOI layer 3 for NMOS transistor T2.

Referring to FIG. 23D, a step similar to that shown in FIG. 6D is carried out for each of PMOS and NMOS transistors T1 and T2. As a result, gate electrode 60 is partially patterned for each of PMOS transistor T1 and NMOS transistor T2.

Referring to FIG. 23E, an interlayer insulating layer 71 is formed covering SOI layer 3, gate electrode layer 60 and field oxide film 4 for each of PMOS and NMOS transistors T1 and T2.

In PMOS transistor T1, interlayer insulating layer 71 on impurity region 31p is removed by etching to form a contact hole 710. In NMOS transistor T2, interlayer insulating layer 71 on impurity region 31n is removed by etching to form a contact hole 710.

In PMOS transistor T1, a polysilicon layer 80 is formed in contact with impurity region 31p via contact hole 710 and covering the surface of interlayer insulating layer 71. Also, in NMOS transistor T2, polysilicon layer 80 is formed in contact with impurity region 31n via contact hole 710 and the covering the surface of interlayer insulating layer 71.

Referring to FIG. 23F, a step similar to that shown in FIG. 21E is carried out. As a result, polypads 8, 8 are formed.

Referring to FIG. 23G, a step similar to that shown in FIG. 7A is carried out for each of PMOS and NMOS transistors T1 and T2. As a result, gate electrodes 6, 6 are formed.

Referring to FIG. 23H, a step similar to that shown in FIG. 7B is carried out for each of PMOS and NMOS transistors T1 and T2. A conductive layer 4 3 of polysilicon is formed instead of storage node 9 in each of PMOS and NMOS transistors T1 and T2.

The CMOS transistor manufactured as shown in FIGS. 23A–23H has polypad 8 of PMOS transistor T1 provided at the power supply node side, and polypad 8 of NMOS transistor T2 provided at the ground node side. Respective conductive layers 4 3 and 4 3 of PMOS transistor T1 and NMOS transistor T2 form output nodes.

Therefore, according to the manufacturing method of a CMOS inverter shown in FIGS. 23A–23H, the amount that is removed from SOI layer 3 can be suppressed. Because such a CMOS inverter has polypads provided at the power supply node and the ground node side, reduction in the circuit operation speed due to provision of a polypad is reduced. Such a CMOS inverter can be applied to circuitry where high speed operation of, for example, a row decoder or a column decoder, is required.

The pair of impurity regions of SOI layer 3 is formed at the same time by ion implantation. It is not necessary to form impurity regions in two stages as in the above described eighth and ninth embodiments. Therefore, the manufacturing process is simplified.

Another example of a DRAM peripheral circuit utilizing an SOI structure will be described hereinafter. The following twelfth to fourteenth embodiments differ from the above-described ninth to eleventh embodiments where polypads are provided at the power supply node side and the ground node side. Polypads are provided at the output node side in a CMOS inverter utilizing an SOI structure.

Twelfth Embodiment

FIGS. 24A–24G are sectional views of a CMOS inverter showing sequential manufacturing steps according to a twelfth embodiment. The left side figures show the manufacturing steps of a PMOS transistor T1 taken along line C—C of FIG. 20, and the right side figures show the manufacturing steps of an NMOS transistor T2 taken along line D—D of FIG. 20.

In contrast to the manufacturing method of a CMOS inverter of FIGS. 21A–21G where polypads 8, 8 are provided at the power supply node side and the ground node side in PMOS and NMOS transistors T1 and T2, polypads 8 and 8 are provided at respective output node sides according to the manufacturing method of a CMOS inverter shown in FIGS. 24A–24G.

The steps shown in FIGS. 24A–24G are similar to those shown in FIGS. 21A–21G except that the formed positions of polypads, 8, 8 and conductive layers 42, 44 differ.

Therefore, the etching process of polysilicon layer 80 and gate electrode layer 60 is carried out in two steps for each of PMOS and NMOS transistors T1 and T2.

Thirteenth Embodiment

FIGS. 25A–25F are sectional views of a CMOS inverter showing the sequential manufacturing steps according to a thirteenth embodiment. Differing from the manufacturing method of a CMOS inverter shown in FIGS. 22A–22F where polypads 8, 8 are provided at the power supply node side and the ground node side in PMOS and NMOS transistors T1 and T2, polypads 8, 8 are provided at respective output node sides according to the manufacturing method of FIGS. 25A–25G.

The steps shown in FIGS. 25A–25F are similar to those of FIGS. 22A–22F except that the formed positions of polypads 8, 8 and conductive layers 42, 44 differ.

Therefore, the etching process of polysilicon layer 80 and gate electrode layer 60 is carried out by one step in each of PMOS and NMOS transistors T1 and T2.

Fourteenth Embodiment

FIGS. 26A–26H show sectional views of a CMOS inverter showing the manufacturing steps according to a fourteenth embodiment.

Differing from the manufacturing method of a CMOS inverter of FIGS. 23A–23H where polypads 8, 8 are provided at the power supply node side and the ground node side for PMOS transistor T1 and NMOS transistor T2, the manufacturing method of FIG. 23 has polypads 8, 8 provided at respective output node sides according to the manufacturing method of the present embodiment.

The steps shown in FIGS. 26A–26H are similar to those of FIGS. 23A–23H except that the formed positions of polypads 8, 8 and conductive layers 42, 44 differ.

Therefore, impurity regions 31p and 32p and impurity regions 31n and 32n are formed simultaneously by ion implantation at an energy on the order of MeV. Also, the etching process of polysilicon layer 80 and gate electrode layer 60 is carried out in two steps.

A CMOS inverter manufactured according to the methods shown in the twelfth to fourteenth embodiments have polypads 8, 8 provided at the output node side. Such an CMOS inverter is increased in the resistance of the output node, so that the operation speed is reduced. Such an CMOS inverter can be applied to a delay circuit, for example, in a DRAM.

Fifteenth Embodiment

The fifteenth embodiment shows another example of a transistor utilizing an SOI structure used in a peripheral circuit of a DRAM. FIGS. 27A–27E are sectional views of a transistor according to the fifteenth embodiment.

Referring to FIGS. 27A and 27B, steps similar to those shown in FIGS. 2A and 2B are carried out. As a result, a gate electrode layer 60 is formed above SOI layer 3 with a gate oxide film 5 therebetween.

Referring to FIG. 27C, the portion of gate electrode layer 60 and gate oxide film 5 in the vicinity of field oxide films 4 and 4 are removed by etching to pattern gate electrode layer 60. As a result, gate electrode 6 is formed. Using gate electrode 6 as a mask, ions are implanted into SOI layer 3. As a result, a pair of impurity regions 31 and 32 are formed in SOI layer 3.

Referring to FIG. 27D, interlayer insulating layer 71 is formed covering SOI layer 3, gate electrode 6 and field oxide films 4, 4.

Interlayer insulating layer 71 on impurity region 31 is removed by etching to form a contact hole 710, and interlayer insulating layer 71 on impurity region 32 is removed by etching to form a contact hole 720. Then, a polysilicon layer 80 is formed in contact with impurity regions 31 and 32 via contact holes 710 and 720, respectively, and covering the surface of interlayer insulating layer 71.

Referring to FIG. 27E, the portion of polysilicon layer 80 and interlayer insulating layer 71 on gate electrode 6 and field oxide films 4, 4 are removed by etching to pattern polysilicon layer 80. As a result, polypads 8, 8 are formed on impurity regions 31 and 32.

The transistor manufactured according to the present embodiment has polypads 8, 8 provided on impurity regions 31 and 32. Therefore, SOI layer 3 is not removed at all during the patterning process of polysilicon layer 80.

The above-described transistor is applicable to any peripheral circuit of a DRAM.

Sixteenth Embodiment

A sixteen embodiment will be described hereinafter. A method of suppressing the amount that is removed from an SOI layer is set forth in the following.

The SOI layer is provided in a salicide (self aligned silicide) structure. More specifically, the MOS transistor of an SOI structure in the peripheral circuit is formed in a salicide structure in the DRAM. Here, the MOS transistor of an SOI structure in the memory cell array portion is not formed in a salicide structure.

A salicide structure of a MOS transistor in a peripheral circuit is formed, for example, as shown in FIGS. 28A and 28B. FIGS. 28A and 28B are sectional views of a silicide structure portion of a MOS transistor in a peripheral circuit showing the manufacturing steps thereof.

Before a silicide layer is formed, a gate electrode 6, and a pair of impurity regions 31 and 32 are formed, as shown in FIG. 28A. Then, molybdenum silicide is introduced into the atmosphere to cause chemical reaction, whereby a silicide layer S is formed on the surface of SOI layer 3 and on gate electrode 6, as shown in FIG. 28B.

Because the MOS transistor in the peripheral circuit has a salicide structure, silicide layer S of SOI layer 3 serves as an etching stopper in the etching process of the conductive layer on gate electrode 6 in a manufacturing process of the peripheral circuit. Therefore, the amount that is removed from SOI layer 3 is suppressed in the peripheral circuit.

The memory cell array portion is manufactured according to the manufacturing method of the first embodiment shown FIGS. 2A–2G, the manufacturing method of the second embodiment shown in FIGS. 5A–5F, or the manufacturing method of the third embodiment shown in FIGS. 6A–6F and FIGS. 7A and 7B.

The present invention is not limited to the above embodiments where a polypad is used in circuitry forming a DRAM, and a polypad may be applied to a memory cell of a static random access memory (referred to as SRAM hereinafter).

FIG. 29 is a circuit diagram of a memory cell of a SRAM employing a polypad.

Referring to FIG. 29, a SRAM memory cell includes a pair of bit lines BL and /BL, a word line WL, driver transistors M1 and M2, and access transistors M3 and M4.

A polypad is provided, for example, in a contact portion C1 between bit line BL and access transistor M3, and a contact portion C2 between bit line /BL and access transistor M4. Thus, a polypad can be applied to a S RAN memory cell.

Figure 32:
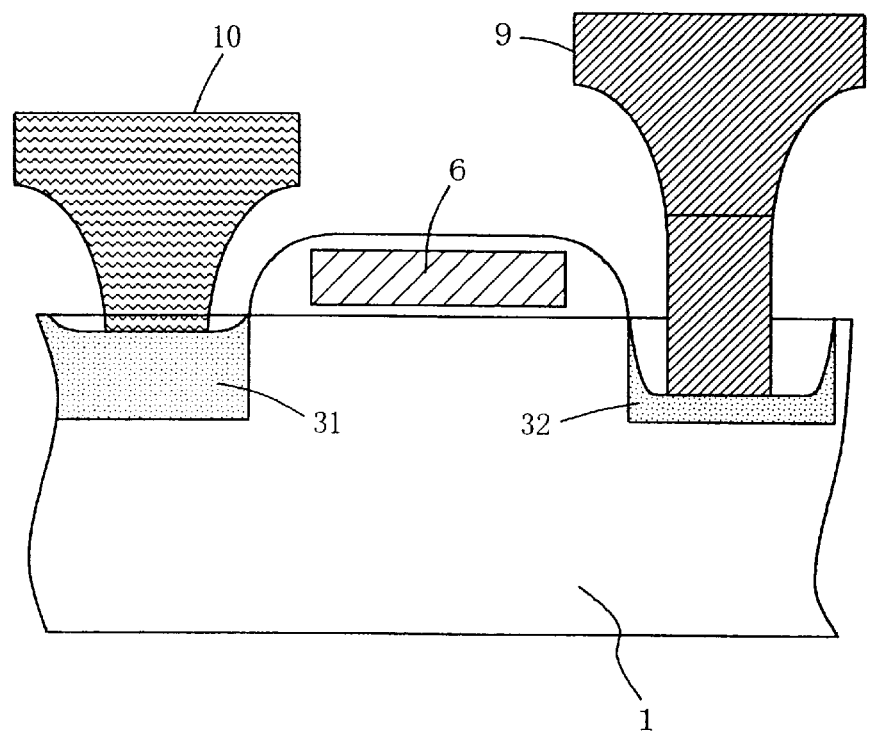
FIG. 32 schematically shows the undesirable difference in the thickness of source and drain regions in a conventional semiconductor device.
Figure 33:
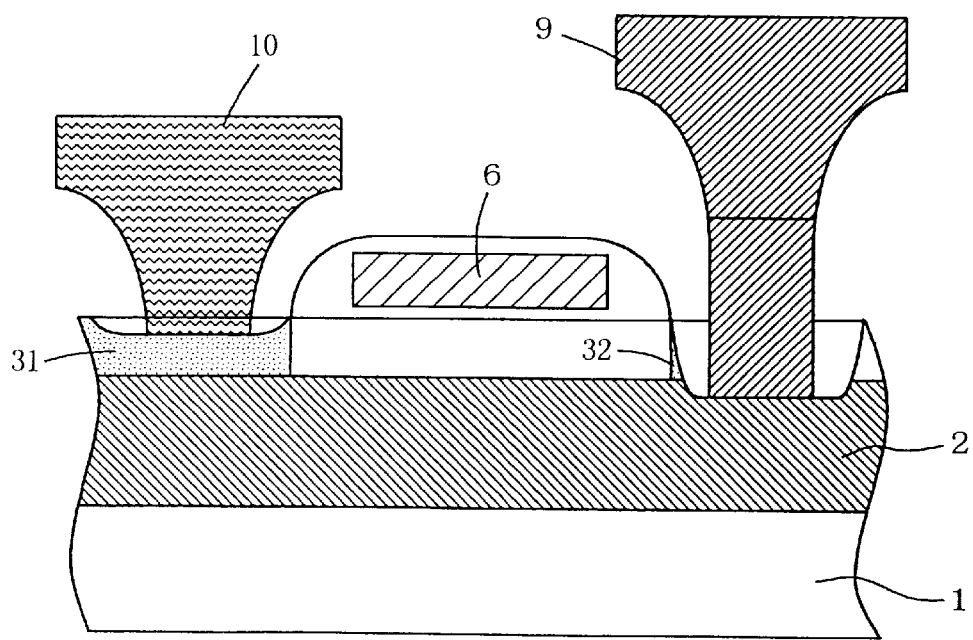
FIG. 33 schematically depicts the occurrence of source/drain regions of different thicknesses in a conventional SOI structure.
Figure 34:
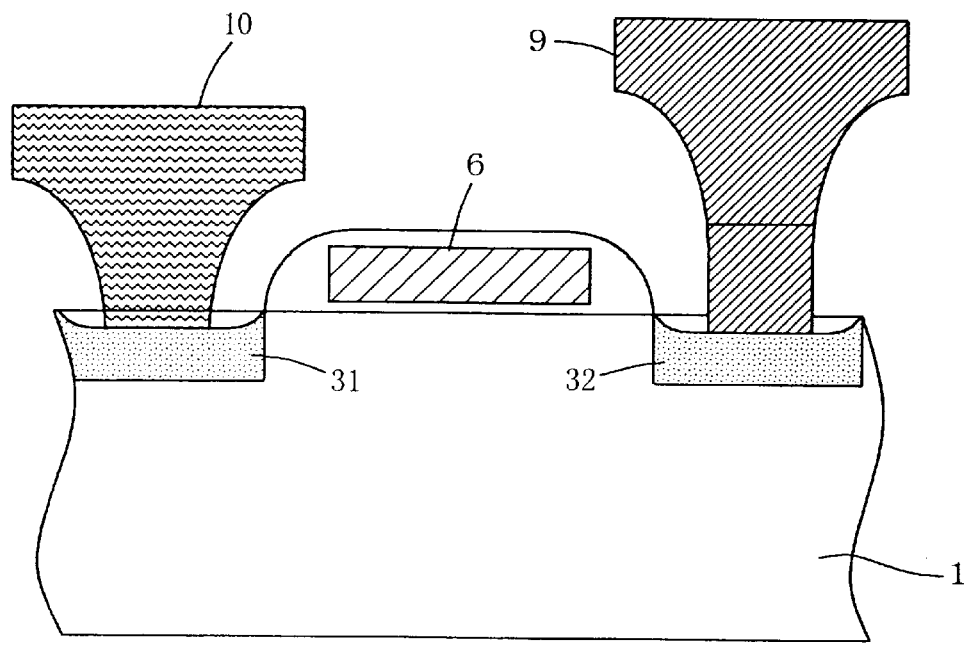
FIG. 34 discloses the advantages of the present invention in forming source/drain regions of the same film thickness.
Figure 35:
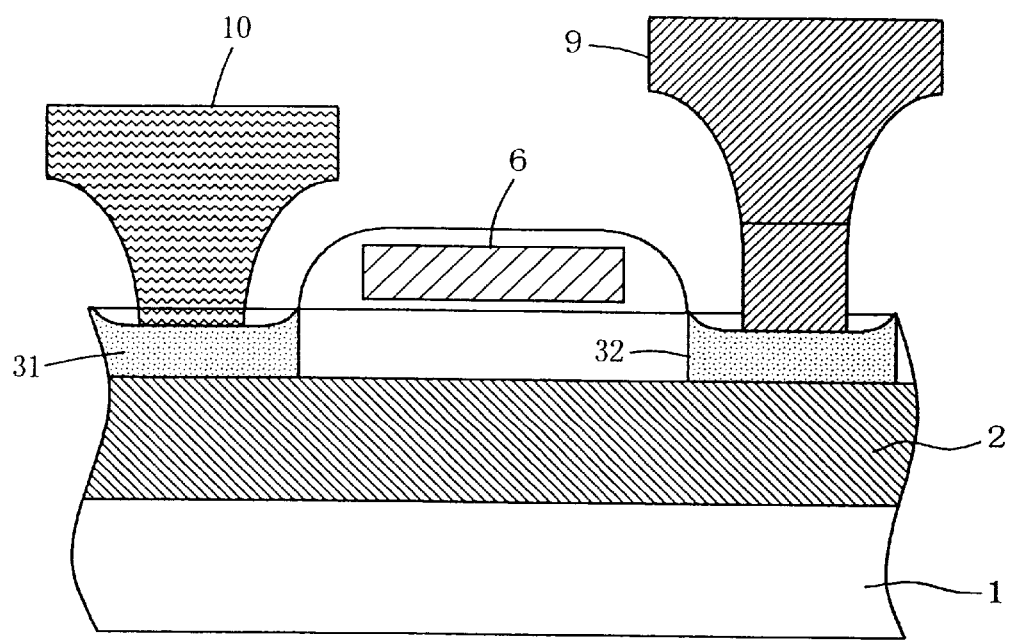
FIG. 35 schematically depicts another embodiment of the invention wherein source/drain regions of the same film thickness are formed in an SOI structure.

In all of the above described embodiments, the following effect can be obtained. According to the above described all embodiments, film thickness of source and drain regions formed on the silicon substrate can be made equal by applying the same number of etching steps to both source and drain regions. FIG. 34 is a schematic diagram showing such situation where the source and drain layers are removed to the same depth. In FIG. 32, one source/drain layer 31 and another source/drain layer 32 formed in a substrate 1 and to be coupled to different layers 10 and 9 are etched to the same depth through the same number of etching steps when forming the corresponding contact holes, resulting in no difference in film thickness between the source and drain sides and no deterioration of transistor characteristics. In case of a transistor formed on a SOI structure as shown in FIG. 35 where the insulating layer is provided, there is no possibility that either one of the source/drain layers 31, 32 may be removed to its entire depth due to overetching and electric contact to the source/drain of the transistor may not be formed.

Figure 2:
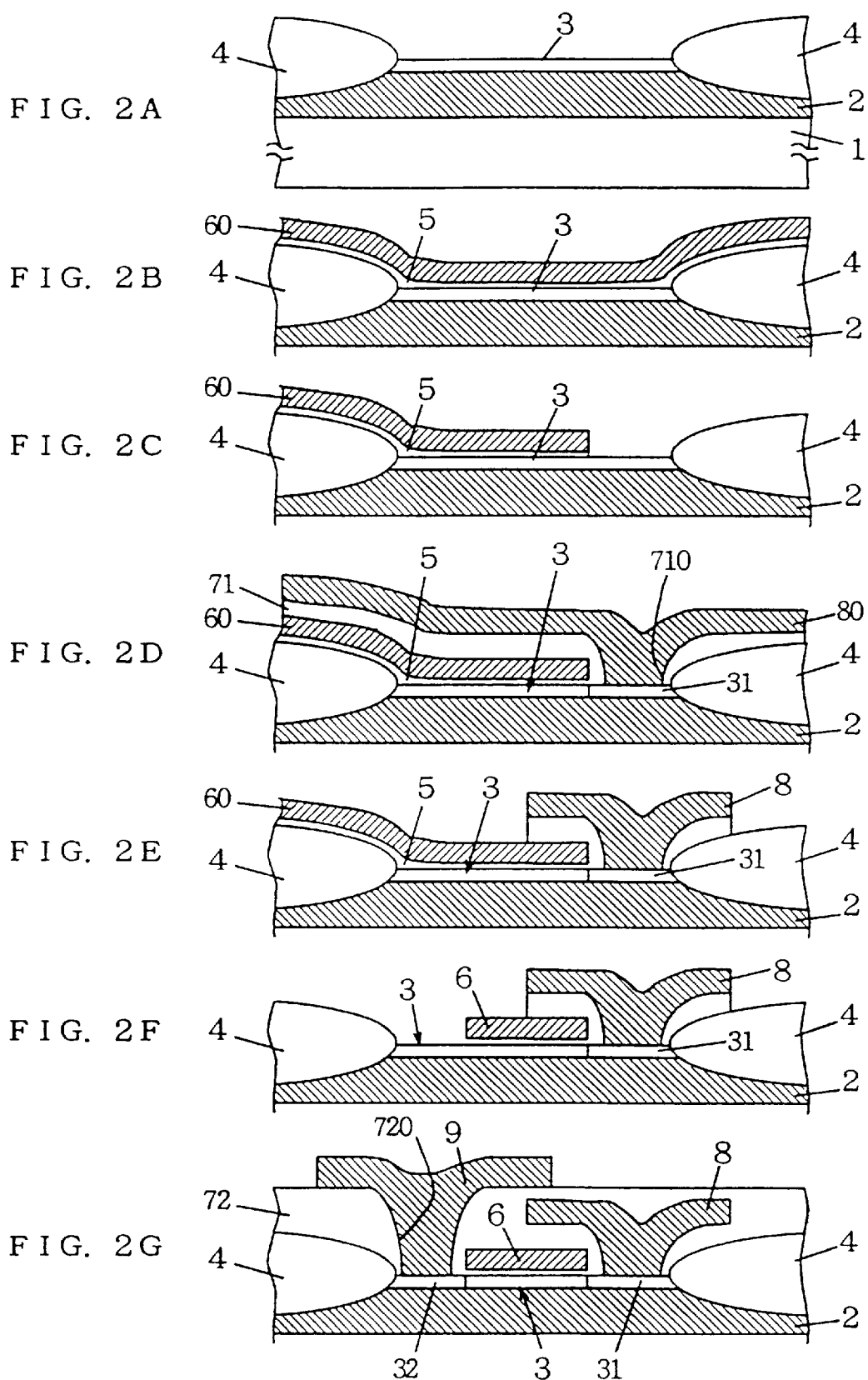
FIGS. 2A–2G are sectional views of a memory cell showing the manufacturing steps in order according to a first embodiment.

More specifically, with reference to the steps of the first embodiment shown in FIG. 2, for example, one source/drain region is damaged only once due to etching of the gate electrode in the step shown in FIG. 2C and another source/drain region is also damaged only once due to etching of the connecting layer in the step shown in FIG. 2F. Since the same number (one) of etching steps is applied to both source and drain regions as described above, there is no difference in film thickness between the source and drain regions. In the second embodiment, one source/drain region is damaged in the step shown in FIG. 5C and another source/drain region is damaged in the step shown in FIG. 5D, resulting in no difference in film thickness between the source and drain regions. In the third embodiment, one source/drain region is damaged in the step shown in FIG. 6D and another source/drain region is damaged in the step shown in FIG. 7A, resulting in no difference in film thickness between the source and drain region. This is the case in all of the other embodiments.

As described in the foregoing, both source and drain regions are damaged (etched) the same number of times, so that there is no difference in film thickness, resulting in good transistor characteristics of transistor formed on the silicon substrate or in SOI structure.

The type of a conductive layer right above a source/drain region differs according to the structure of a memory cell. Therefore, the concept of the present invention is applicable to the case where the conductive layer right above a source/drain region is a polypad, a storage node interconnection layer, or a bit line interconnection layer.

The present invention is not limited to the above-described embodiments where a stacked type DRAM memory cell or a trench type DRAM memory cell is shown. The present invention is applicable for memory cells of other structures.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a transistor including a source and a drain formed on a semiconductor substrate separated by a channel, and having a gate electrode above the channel with a gate insulating film therebetween, wherein the source and the drain of the transistor have been exposed to the same number of etching steps and have the same film thickness;

a first component coupled to one of the source and the drain via a first contact hole having a first depth; and a second component coupled to the other of the source and drain via a second contact hole having a second depth different from the first depth.

2. The semiconductor device according to claim 1, wherein said transistor is a memory cell transistor of a DRAM.

3. The semiconductor device according to claim 1, wherein said transistor constitutes a stack-type memory cell of a DRAM, the stack-type memory cell including a capacitor, said capacitor includes (i) said first component as a storage node, (ii) a dielectric film on the storage node and (iii) a cell plate on the dielectric film, said second component constitutes a bit line underlying the storage node.

4. The semiconductor device according to claim 1, wherein said transistor constitutes a stack-type memory cell of a DRAM, the stack-type memory cell including a capacitor.

said capacitor including (i) said first component as a storage node, (ii) a dielectric film on the storage node and (iii) a cell plate on the dielectric film, said second component constitutes a bit line overlying the storage node.

5. A trench-type memory cell of a DRAM comprising:

a transistor including a source and a drain formed on a semiconductor substrate separated by a channel, and having a gate electrode above the channel with a gate insulating film therebetween, wherein the source and the drain of the transistor have been exposed to the same number of etching steps, and one of the source and the drain is coupled to a bit line component; and a capacitor formed in a trench in the substrate and including (i) a storage node connected to the other of the source and the drain, (ii) a dielectric film on the storage node and (iii) a cell plate on the dielectric film.

6. The semiconductor device according to claim 1, wherein said transistor constitutes a CMOS inverter in a peripheral circuit of a DRAM.

7. The semiconductor device according to claim 1, wherein said semiconductor substrate has an SOI structure including an insulation layer on which the source and drain of said transistor are formed.

8. The semiconductor device according to claim 7, wherein said transistor is a memory cell transistor of a DRAM.

9. The semiconductor device according to claim 7, wherein said transistor constitutes a stack-type memory cell of a DRAM, the stack-type memory cell including a capacitor, said capacitor includes (i) said first component as a storage node, (ii) a dielectric film on the storage node and (iii) a cell plate on the dielectric film, said second component constitutes a bit line underlying the storage node.

10. The semiconductor device according to claim 7, wherein said transistor constitutes a stack-type memory cell of a DRAM, the stack-type memory cell including a capacitor, said capacitor includes (i) said first component as a storage node, (ii) a dielectric film on the storage node and (iii) a cell plate on the dielectric film, said second component constitutes a bit line overlying the storage node.

11. The trench-type memory cell according to claim 5, wherein said semiconductor substrate has an SOI structure including an insulation layer on which the source and drain of said transistor are formed.

12. The semiconductor device according to claim 6, wherein said semiconductor substrate has an SOI structure including an insulation layer on which the source and drain of said transistor are formed.

13. A semiconductor device comprising a transistor including a source and a drain formed on a semiconductor substrate separated by a channel and having a gate electrode above the channel with a gate insulating film therebetween, the source and the drain each having a concavity on a surface thereof to the substantially same depth;

a first component coupled to one of the source and the drain via a first contact hole having a first depth; and a second component coupled to the other of the source and drain via a second contact hole having a second depth different from the first depth.

14. The semiconductor device according to claim 13, wherein said transistor is a memory cell transistor of a DRAM.

15. A trench-type memory cell of a DRAM comprising:

a transistor including a source and a drain formed on a semiconductor substrate separated by a channel, and having a gate electrode above the channel with a gate insulating film therebetween, the source and the drain of the transistor each having a concavity on a surface thereof to the substantially same depth, one of the source and the drain being connected to a bit line component; and a capacitor formed in a trench in the substrate and including (i) a storage node connected to the other of the source and the drain, (ii) a dielectric film on the storage node and (iii) a cell plate on the dielectric film.

16. The semiconductor device according to claim 13, wherein said semiconductor substrate has an SOI structure including an insulation layer on which the source and drain of said transistor are formed.

17. The semiconductor device according to claim 16, wherein said transistor is a memory cell transistor of a DRAM.

18. The trench-type memory cell according to claim 15, wherein said semiconductor substrate has an SOI structure including an insulation layer on which the source and drain of said transistor are formed.

* * * * *

UNITED STATES PATENT AND TRADEMARK OFFICE
CERTIFICATE OF CORRECTION

PATENT NO. : 6,215,141 B1
DATED : April 10, 2001
INVENTOR(S) : Hideto Hidaka, et al.

It is certified that error appears in the above-identified patent and that said Letters Patent is hereby corrected as shown below:

Title page,
Under item "[73] Assignee:", change "Mitsubhishi Denki Kabsuhiki Kaisha" to
-- Mitsubishi Denki Kabushiki Kaisha --;

Under item "[63] Related U.S. Application Data", after "Pat. No. 6,060,738", insert
-- which is a division of application No. 08/342,024, filed on Nov. 16, 1994, now
U.S. Pat. No. 5,512,501 --.

Column 1,
Line 9, after "issued May 9, 2000", insert -- , which is a division of application
Ser. No. 08/342,024, filed Nov. 16, 1994, now U.S. Pat. No. 5, 512,501, issued Apr.
30, 1996 --.

Column 5,
Line 6, change "A--A" to -- IV-IV --;
Line 21, change "B--B" to -- X-X --;

Column 7,
Line 67, change "A-A" to -- IV-IV --;

Column 13,
Line 36, change "C-C" to -- XXIa-XXIa --;
Line 38, change "D-D" to -- XXIb-XXIb --;

Column 15,
Line 63, change "C-C" to -- XXIa-XXIa --;
Line 65, change "D-D" to -- XXIb-XXIb --;

Signed and Sealed this

Thirteenth Day of November, 2001

Attest:

NICHOLAS P. GODICI
Attesting Officer   Acting Director of the United States Patent and Trademark Office